(12) United States Patent
Sharangpani et al.

(10) Patent No.: US 12,376,299 B2
(45) Date of Patent: Jul. 29, 2025

(54) THREE-DIMENSIONAL MEMORY DEVICE WITH INTERMETALLIC BARRIER LINER AND METHODS FOR FORMING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 734 days.

(21) Appl. No.: 17/244,456

(22) Filed: Apr. 29, 2021

(65) Prior Publication Data
US 2022/0352198 A1    Nov. 3, 2022

(51) Int. Cl.
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 41/27; H10B 43/10; H10B 41/35; H10B 43/35; H10B 41/10; H10B 43/27; H10D 64/037
See application file for complete search history.

(56) References Cited

U.S. PATENT DOCUMENTS

| | | |
|---|---|---|
| 5,488,014 A | 1/1996 | Harada et al. |
| 6,759,324 B1 | 7/2004 | Rhodes et al. |
| 9,397,046 B1 | 7/2016 | Sharangpani |
| 9,698,152 B2 | 7/2017 | Peri et al. |
| 9,748,174 B1 | 8/2017 | Amano |

(Continued)

OTHER PUBLICATIONS

ISR—Notification of Transmittal of The International Search Report and Written Opinion of the International Searching Authority for International Patent Application No. PCT/US2021/065390, mailed Jun. 1, 2022, 11 pages.

(Continued)

*Primary Examiner* — Ali Naraghi
(74) *Attorney, Agent, or Firm* — THE MARBURY LAW GROUP PLLC

(57) ABSTRACT

A three-dimensional memory device includes an alternating stack of insulating layers and electrically conductive layers, memory openings vertically extending through the alternating stack, and memory opening fill structures located in the memory openings. Each of the memory opening fill structures includes a vertical stack of memory elements located at levels of the electrically conductive layers. Each of the electrically conductive layers includes a metallic barrier liner containing an intermetallic compound of at least two elements that includes a first metal element including Ta or Ti, and a second metal element including at least one of Al or Mo, and metallic barrier liner containing less than 10 atomic percent of nitrogen and oxygen, and a metallic fill material layer contacting the metallic barrier liner.

20 Claims, 28 Drawing Sheets

(56) References Cited

U.S. PATENT DOCUMENTS

| | | | |
|---|---|---|---|
| 9,793,139 | B2 | 10/2017 | Sharangpani et al. |
| 9,799,671 | B2 | 10/2017 | Pachamuthu et al. |
| 9,984,963 | B2* | 5/2018 | Peri .................. H10B 41/50 |
| 10,115,459 | B1 | 10/2018 | Yamada et al. |
| 10,229,931 | B1 | 3/2019 | Hinoue et al. |
| 10,262,945 | B2 | 4/2019 | Makala et al. |
| 10,276,583 | B2 | 4/2019 | Sharangpani et al. |
| 10,283,513 | B1 | 5/2019 | Zhou et al. |
| 10,355,139 | B2 | 7/2019 | Sharangpani et al. |
| 10,361,213 | B2 | 7/2019 | Sharangpani et al. |
| 10,615,123 | B2 | 4/2020 | Hinoue et al. |
| 10,707,233 | B1 | 7/2020 | Cui et al. |
| 10,818,542 | B2 | 10/2020 | Cui et al. |
| 10,840,259 | B2 | 11/2020 | Rabkin et al. |
| 11,028,488 | B2* | 6/2021 | Kim ..................... C23F 1/30 |
| 2015/0279680 | A1* | 10/2015 | Kashefi ............ H01L 29/4966 438/592 |
| 2016/0111439 | A1 | 4/2016 | Tsutsumi et al. |
| 2016/0300848 | A1 | 10/2016 | Pachamuthu et al. |
| 2017/0125538 | A1 | 5/2017 | Sharangpani et al. |
| 2017/0373197 | A1 | 12/2017 | Sharangpani et al. |
| 2018/0033646 | A1 | 2/2018 | Sharangpani et al. |
| 2018/0151497 | A1 | 5/2018 | Makala et al. |
| 2018/0197876 | A1* | 7/2018 | Ge ..................... H10B 41/41 |
| 2018/0331118 | A1 | 11/2018 | Amano |
| 2019/0139973 | A1 | 5/2019 | Zhou et al. |
| 2019/0148392 | A1* | 5/2019 | Kanno ................ H10B 41/10 257/66 |
| 2019/0206885 | A1* | 7/2019 | Wang ................. H01L 21/765 |
| 2019/0287916 | A1 | 9/2019 | Sharangpani et al. |
| 2019/0287982 | A1 | 9/2019 | Hinoue et al. |
| 2019/0326306 | A1* | 10/2019 | Mushiga ............ H10B 41/10 |
| 2020/0006376 | A1* | 1/2020 | Makala ............... H10B 43/10 |
| 2020/0051993 | A1 | 2/2020 | Rabkin et al. |
| 2020/0312874 | A1* | 10/2020 | Kang .............. H01L 21/32055 |
| 2020/0395310 | A1 | 12/2020 | Mukae et al. |
| 2021/0082936 | A1* | 3/2021 | Koshizawa ........... H10B 41/27 |

OTHER PUBLICATIONS

Farahani, M.M. et al., "Evaluation of Titanium as a Diffusion Barrier Between Aluminum and Silicon for 1.2 μm CMOS Integrated Circuits," Journal of The Electrochemical Society, vol. 134, No. 11, DOI:10.1149/1.2100298.

Blakeney, K. J. et al., "Atomic Layer Deposition of Aluminum Metal Films Using A Thermally Stable Aluminum Hydride Reducing Agent," Chem. Mater. 2018, vol. 30, pp. 1844-1848, http://pubs.acs.org/action/showCitFormats?doi=10.1021/acs.chemmater.8b00445.

Endoh et al., "Novel Ultra High Density Memory with a Stacked-Surrounding Gate Transistor (S-SGT) Structured Cell," IEDM Proc. (2001) 33-36.

Gall, D., "Electron Mean Free Path in Elemental Metals," J. Appl. Phys., vol. 119, 085101 (2016); https://doi.org/10.1063/1.4942216.

Hofer, A. M. et al., "Improvement of Oxidation and Corrosion Resistance of Mo Thin Films by Alloying with Ta," Thin Solid Films, vol. 599, pp. 1-6, (2016). http://dx.doi.org/10.1016/j.tsf.2016.12.052.

Sato, M. et al., "Reactive Ion Etching of Aluminum Using $SiCl_4$," Journal of Vacuum Science and Technology, vol. 20, pp. 186-190, (1982); https://doi.org/10.1116/1.571954.

U.S. Appl. No. 17/155,541, filed Jan. 22, 2021, SanDisk Technologies LLC.

* cited by examiner

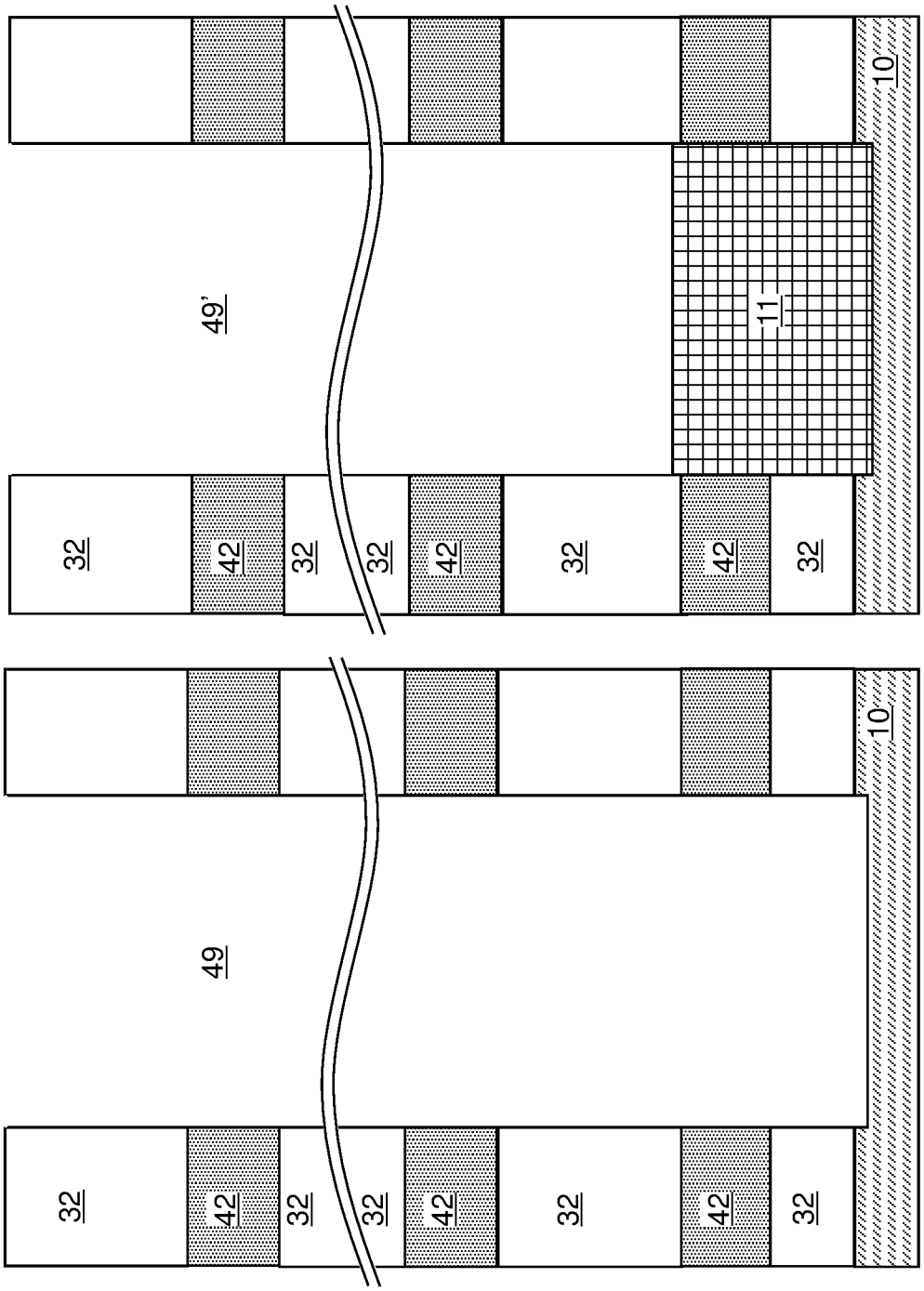

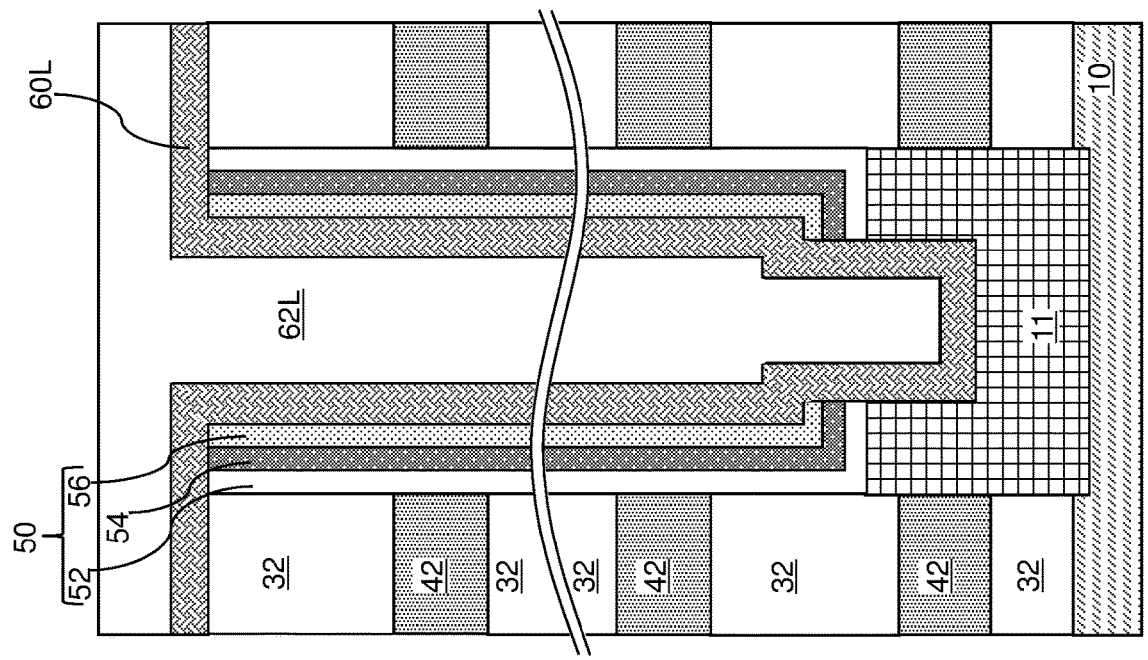
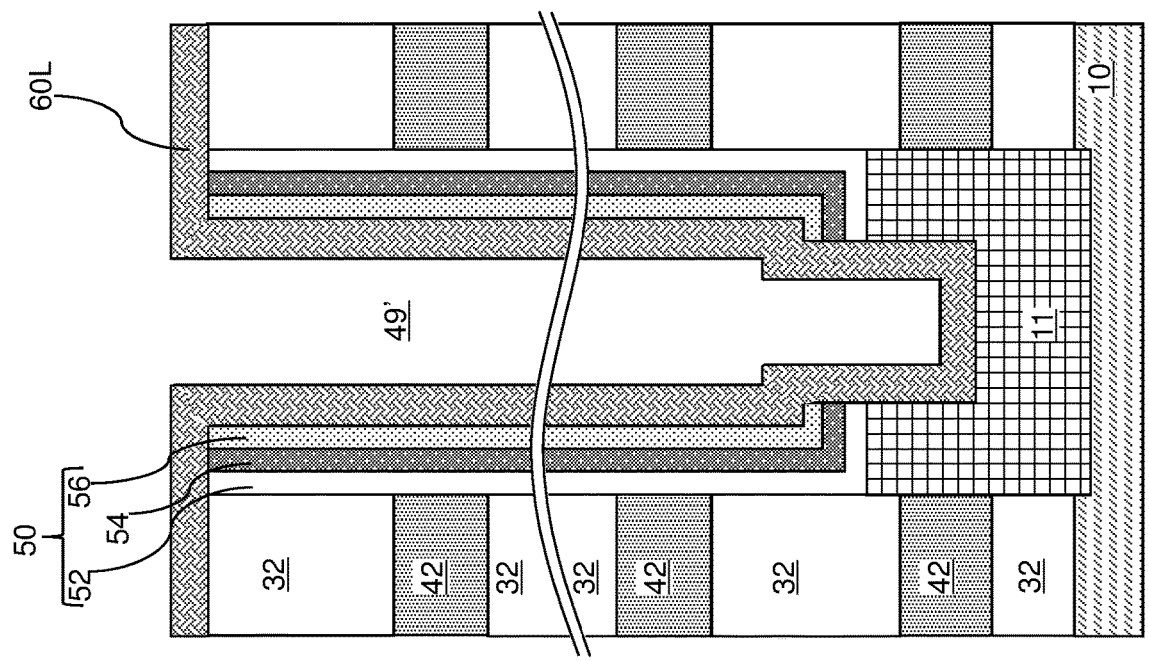

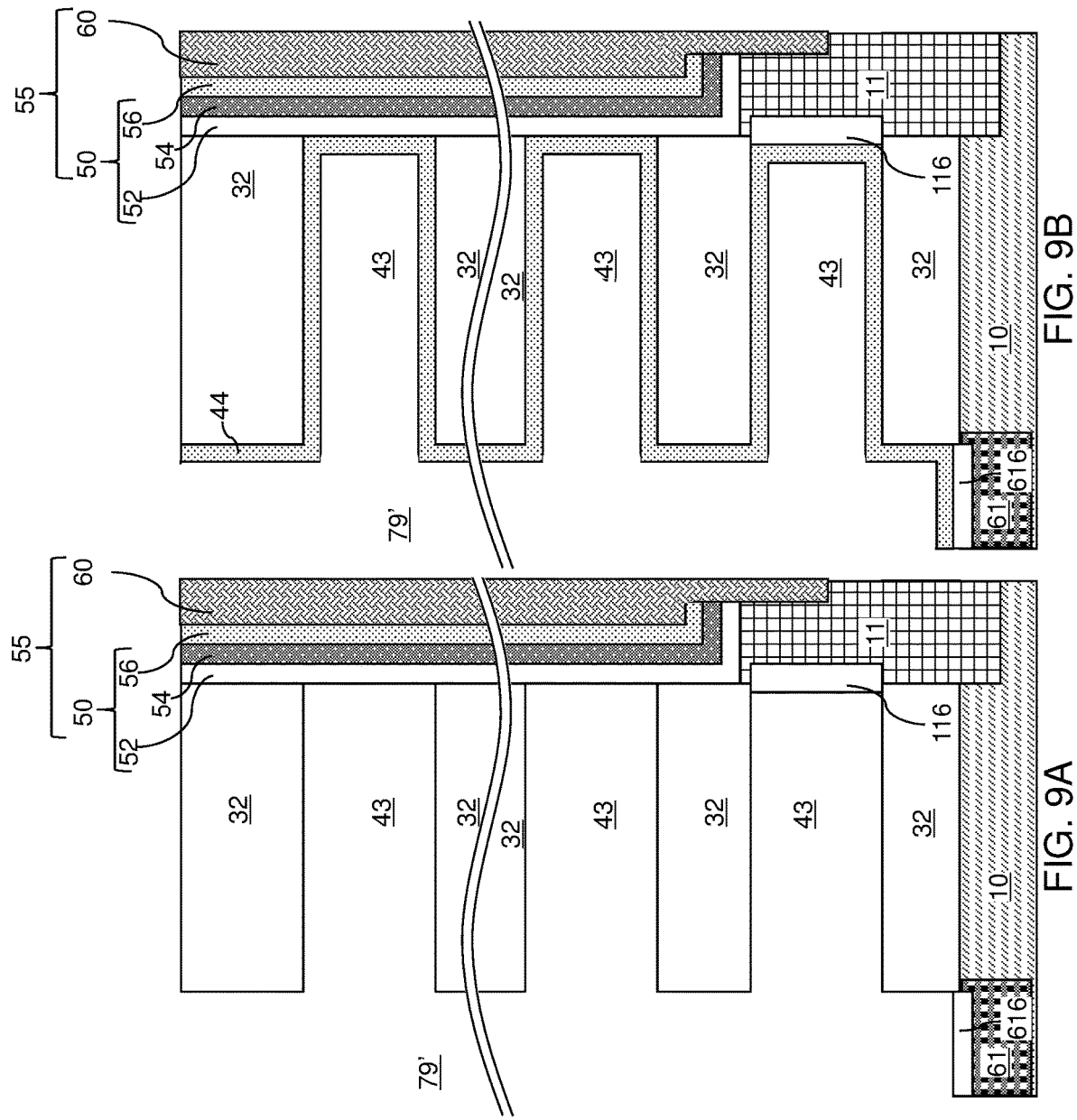

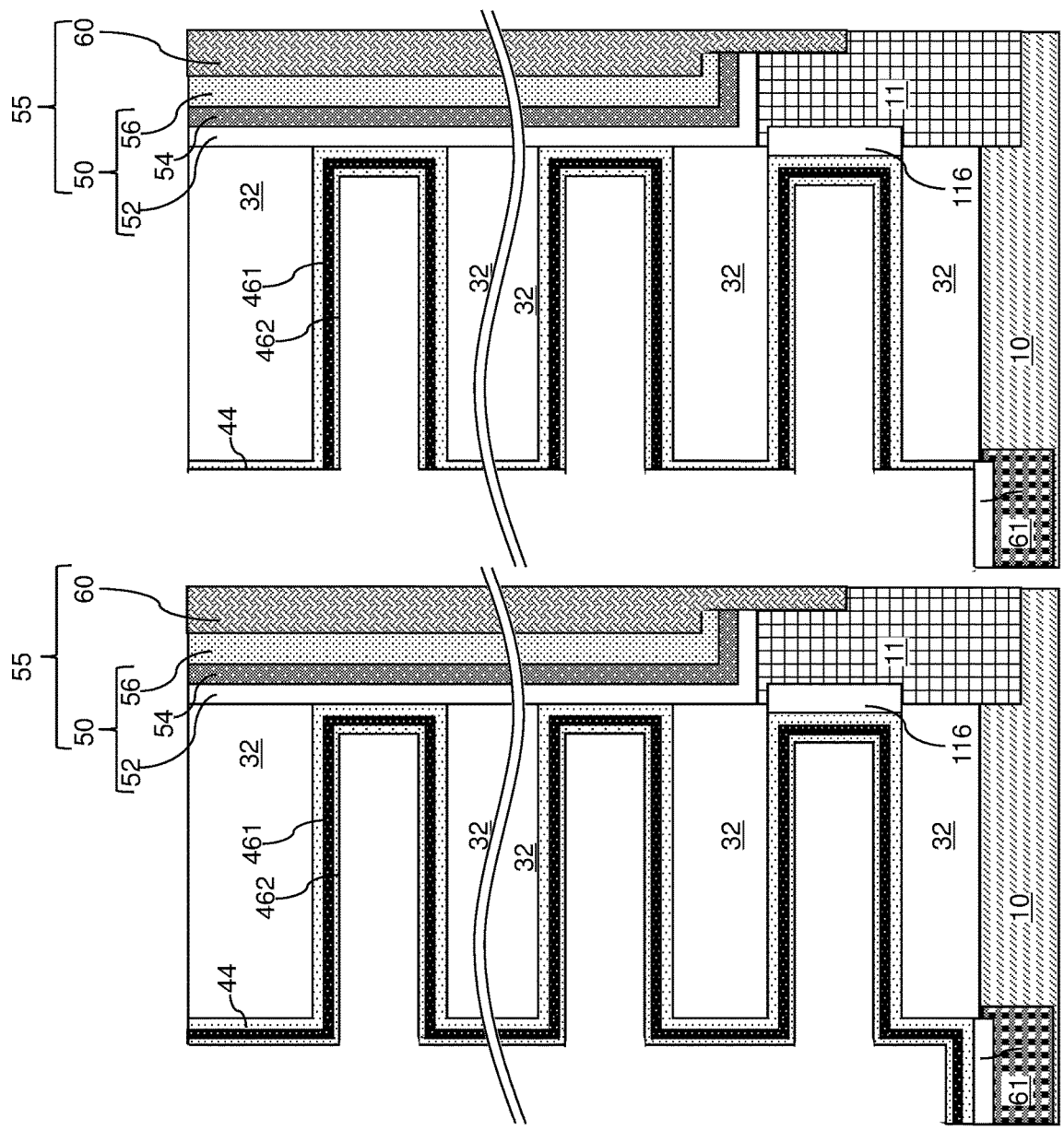

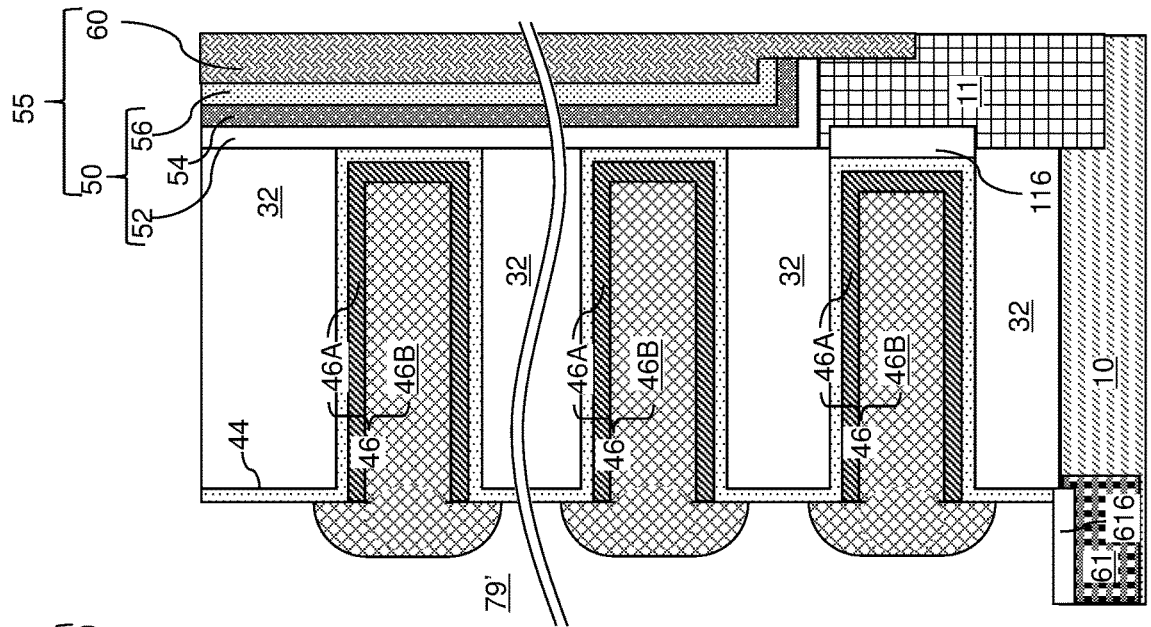
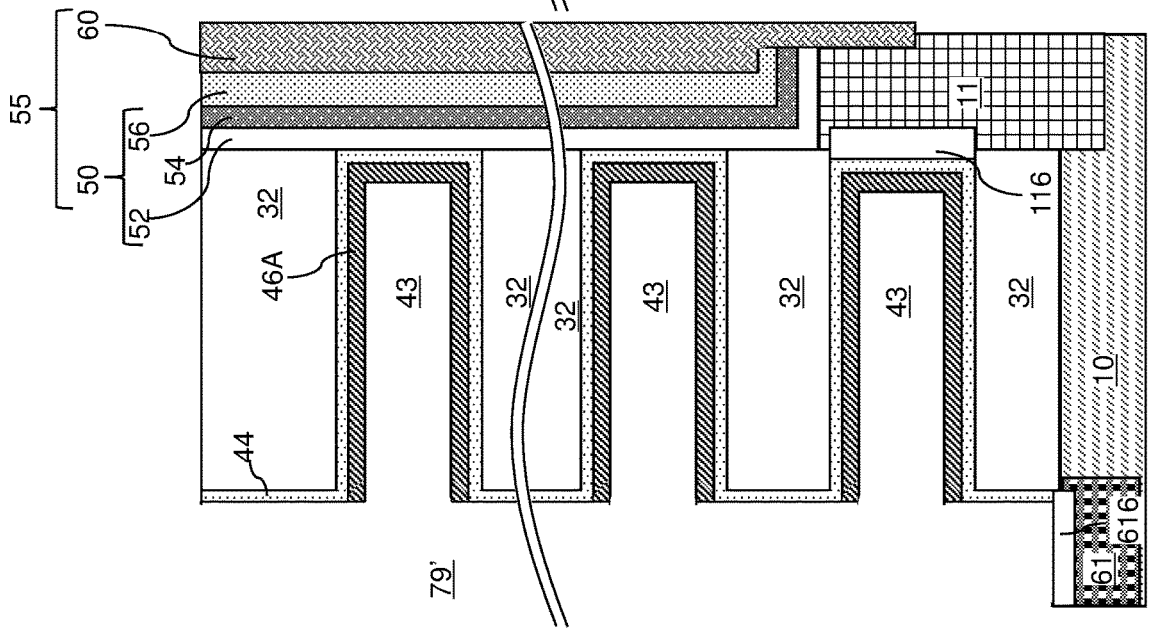
FIG. 9E
FIG. 9F

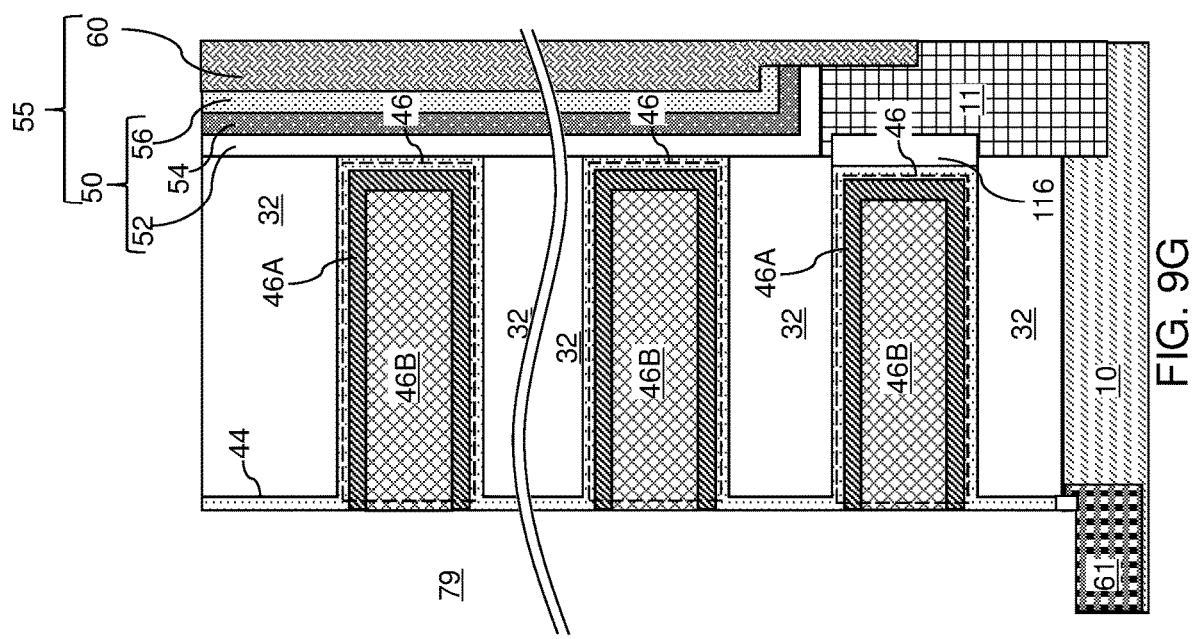

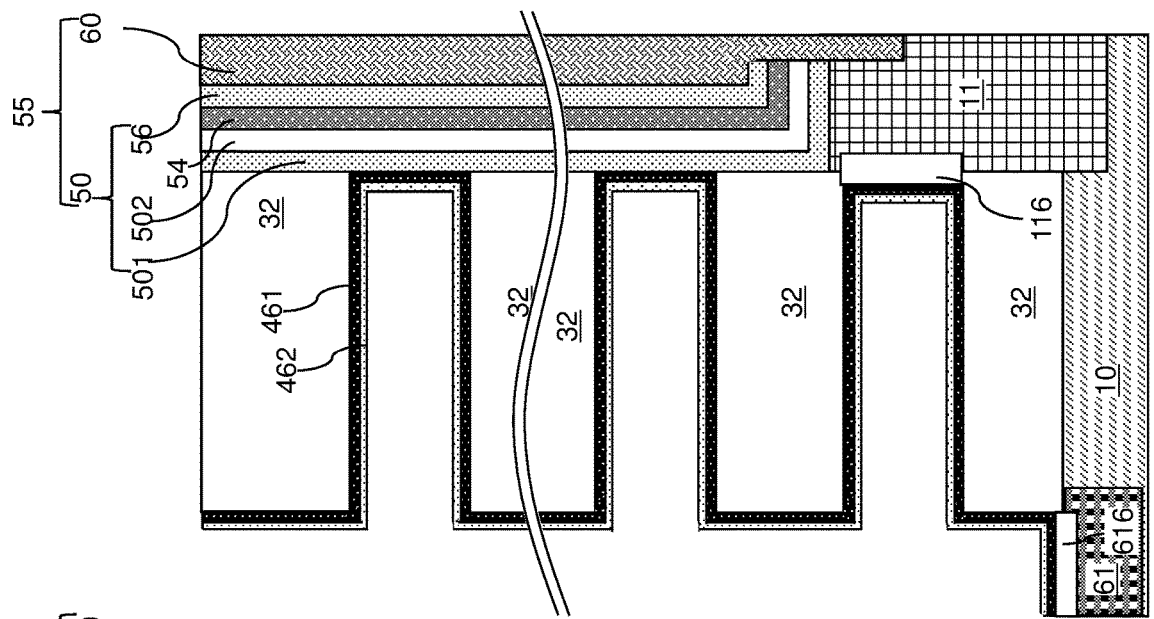
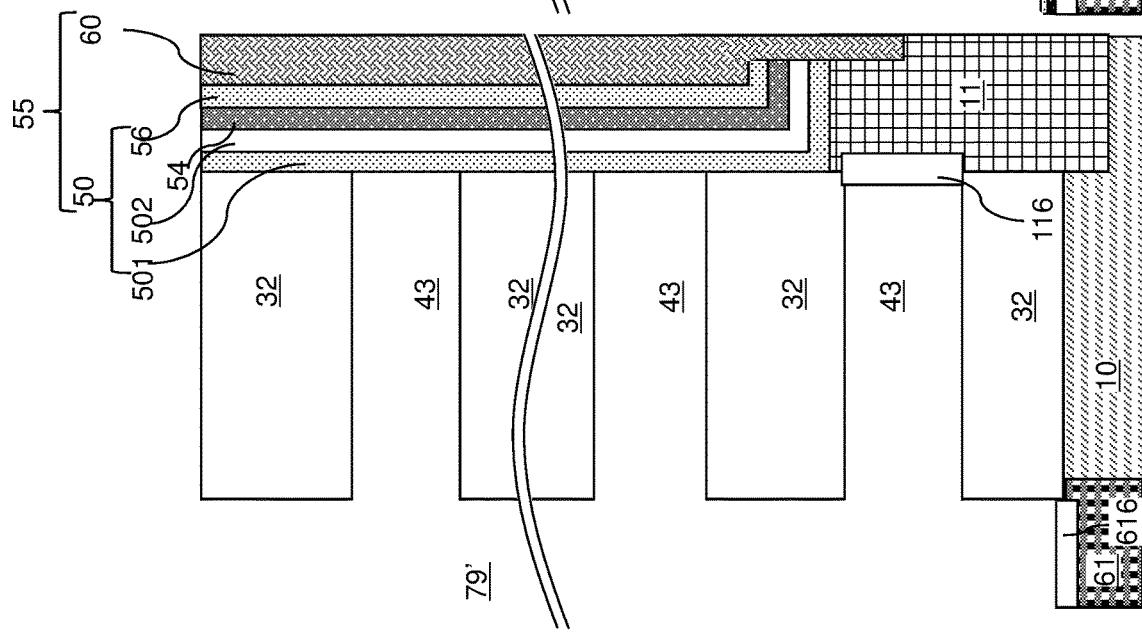

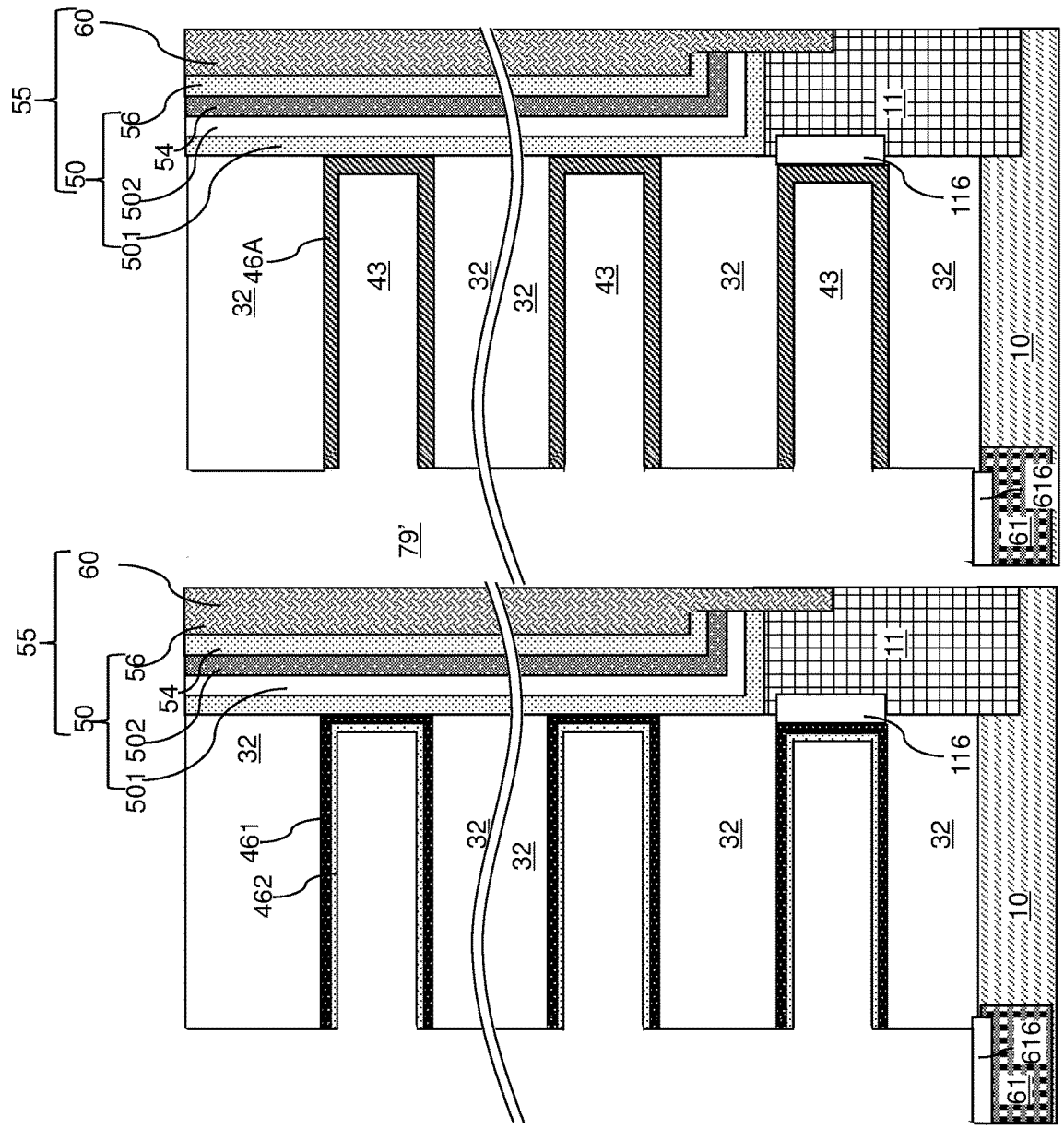

THREE-DIMENSIONAL MEMORY DEVICE WITH INTERMETALLIC BARRIER LINER AND METHODS FOR FORMING THE SAME

FIELD

The present disclosure relates generally to the field of semiconductor devices, and particularly to a three-dimensional memory device with a low-resistivity intermetallic barrier liner and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers, memory openings vertically extending through the alternating stack, and memory opening fill structures located in the memory openings. Each of the memory opening fill structures includes a vertical stack of memory elements located at levels of the electrically conductive layers. Each of the electrically conductive layers includes a metallic barrier liner containing an intermetallic compound of at least two elements that includes a first metal element including Ta or Ti, and a second metal element including at least one of Al or Mo, and metallic barrier liner containing less than 10 atomic percent of nitrogen and oxygen, and a metallic fill material layer contacting the metallic barrier liner.

According to another aspect of the present disclosure, a method of forming a three-dimensional memory device comprises forming an alternating stack of insulating layers and sacrificial material layers over a substrate, forming memory openings through the alternating stack, forming memory opening fill structures in the memory openings, wherein each of the memory opening fill structures comprises a vertical stack of memory elements, forming backside recesses by removing the sacrificial material layers selective to the insulating layers, forming a first metallic component layer selected from Ta or Ti, and a second metallic component layer selected from at least one of Al or Mo in the backside recesses, forming a metallic barrier liner in the backside recesses by annealing the first metallic component layer and the second metallic component layer to form an intermetallic compound, and forming a metallic fill material layer within remaining volumes of the backside recesses, wherein each contiguous combination of a respective one of the metallic barrier liner and a respective one of the metallic fill material layers constitutes an electrically conductive layer.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9G are sequential vertical cross-sectional views of a region of the exemplary structure during formation of electrically conductive layers according to an embodiment of the present disclosure.

FIGS. 13A-13F are sequential vertical cross-sectional views of a region of an alternative embodiment of the exemplary structure during formation of electrically conductive layers according to an embodiment of the present disclosure.

DETAILED DESCRIPTION

Figure 1:
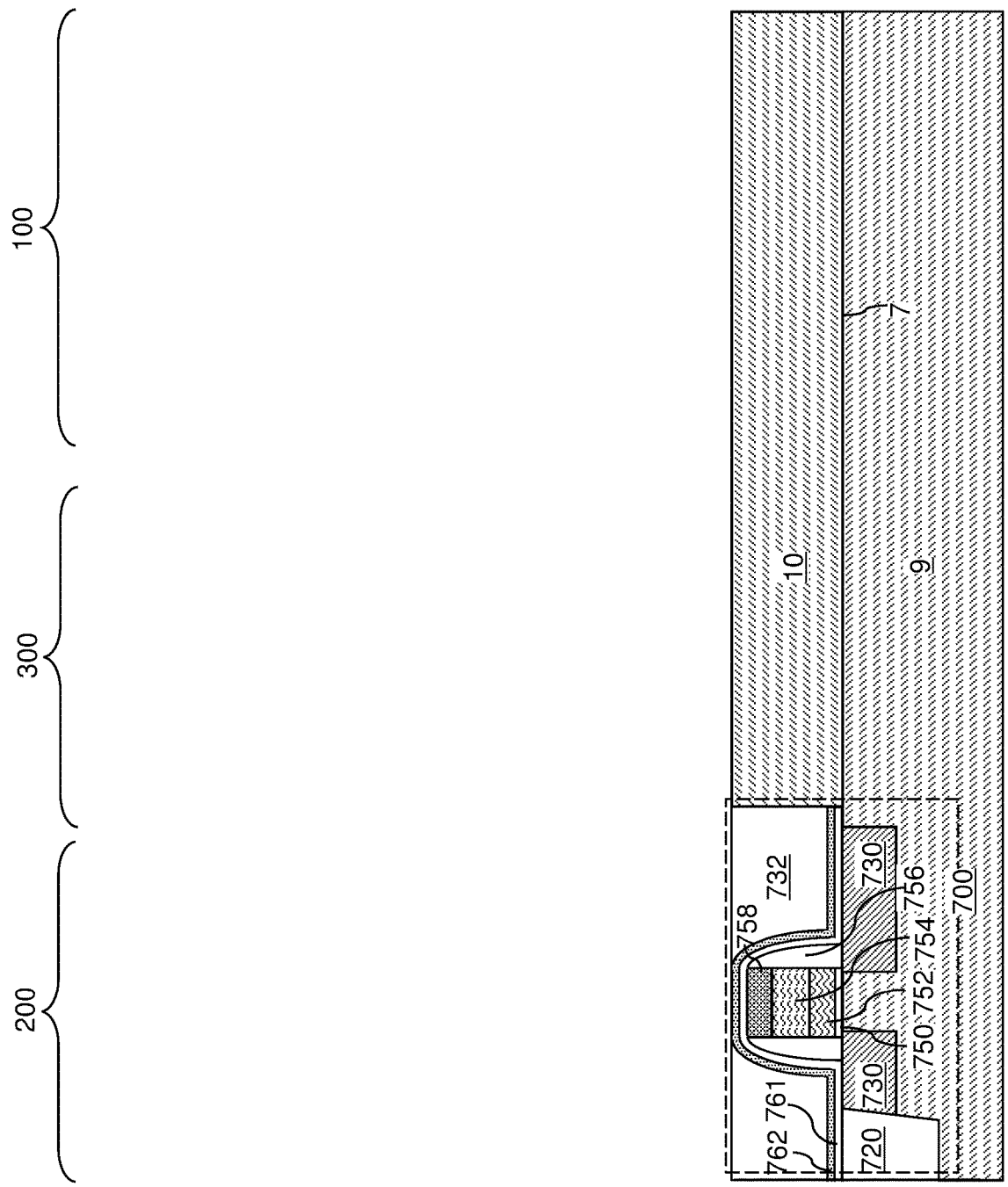
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device containing a low-resistivity intermetallic barrier liner and methods of manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
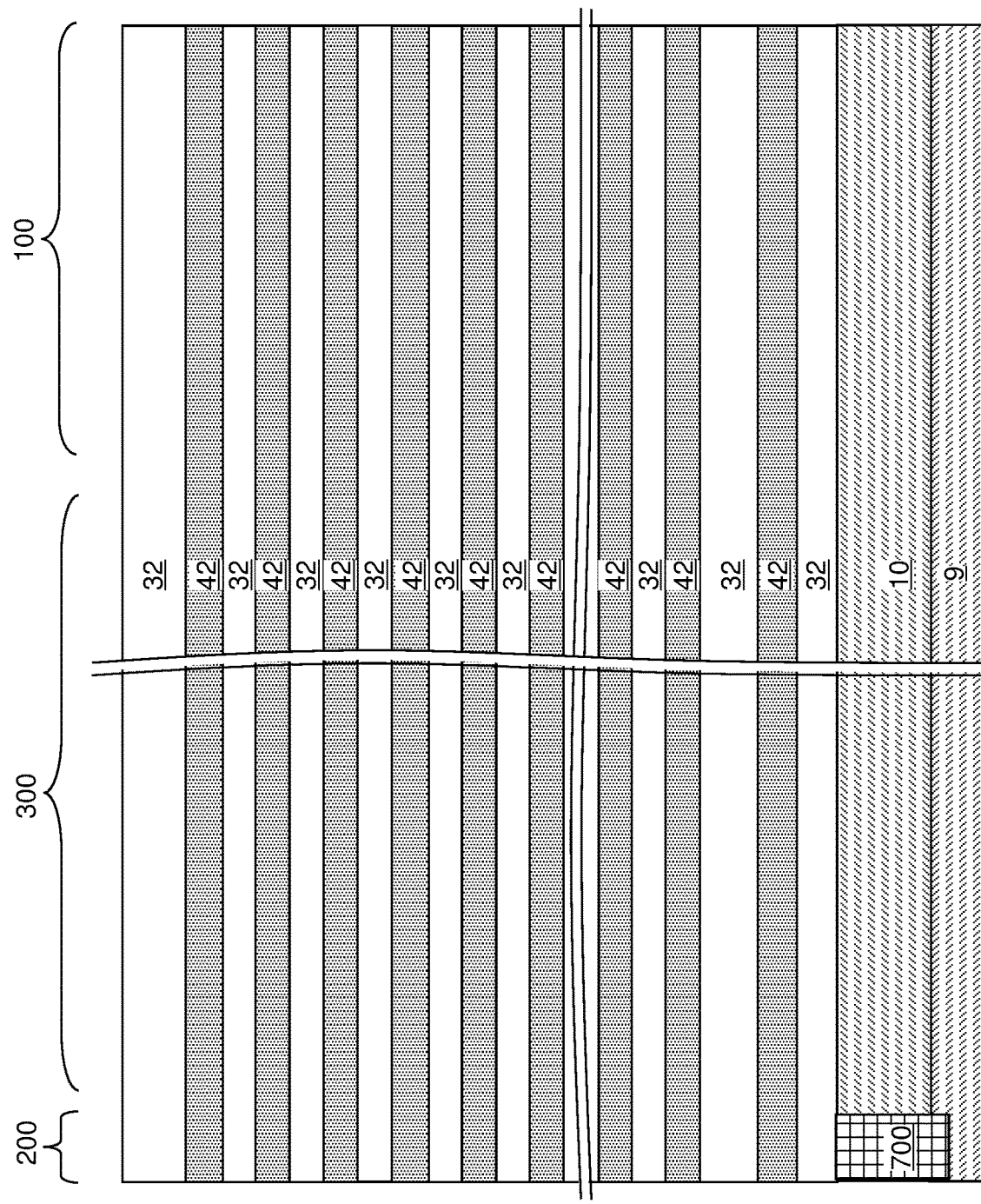
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
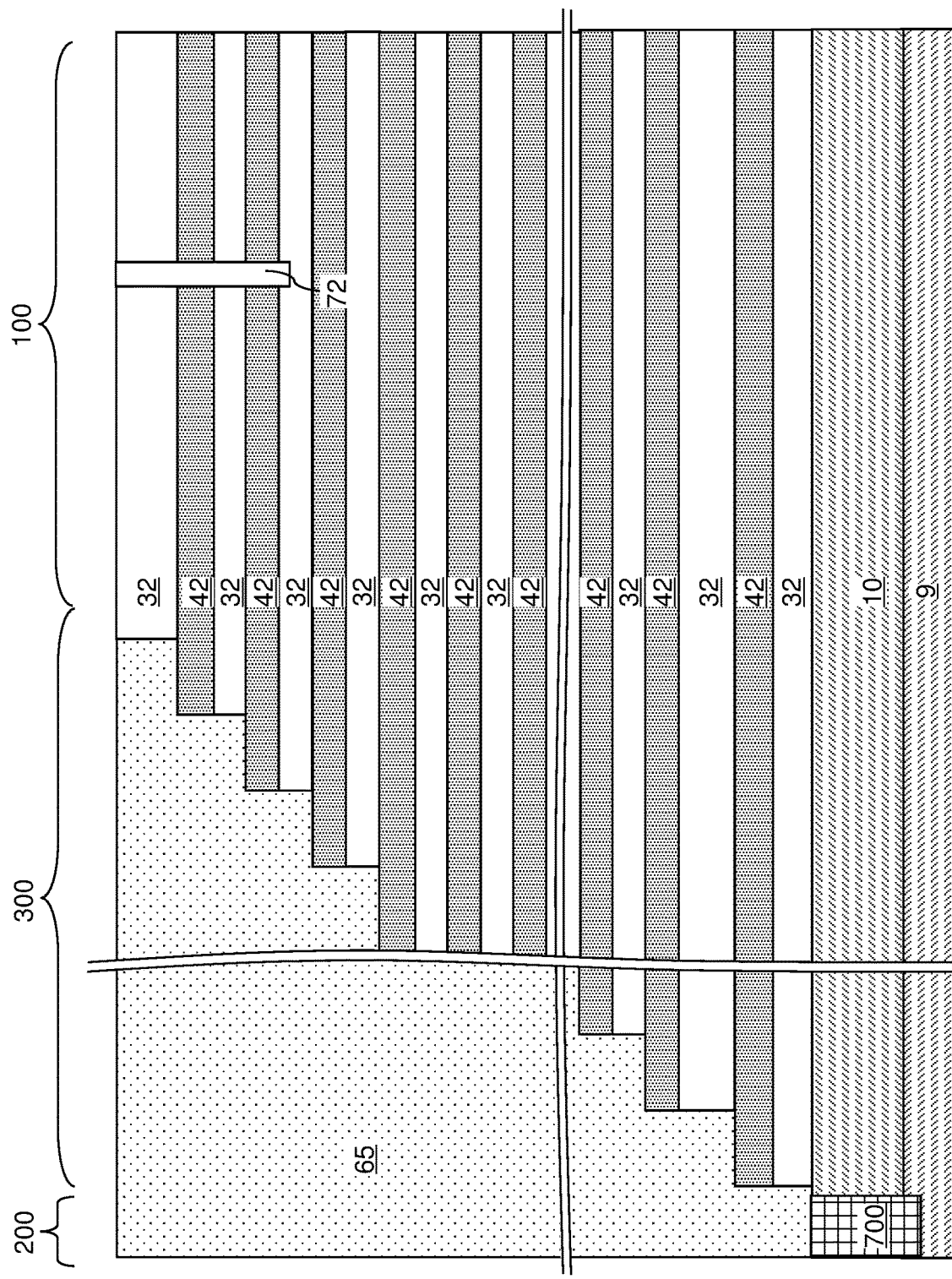
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain-select-levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
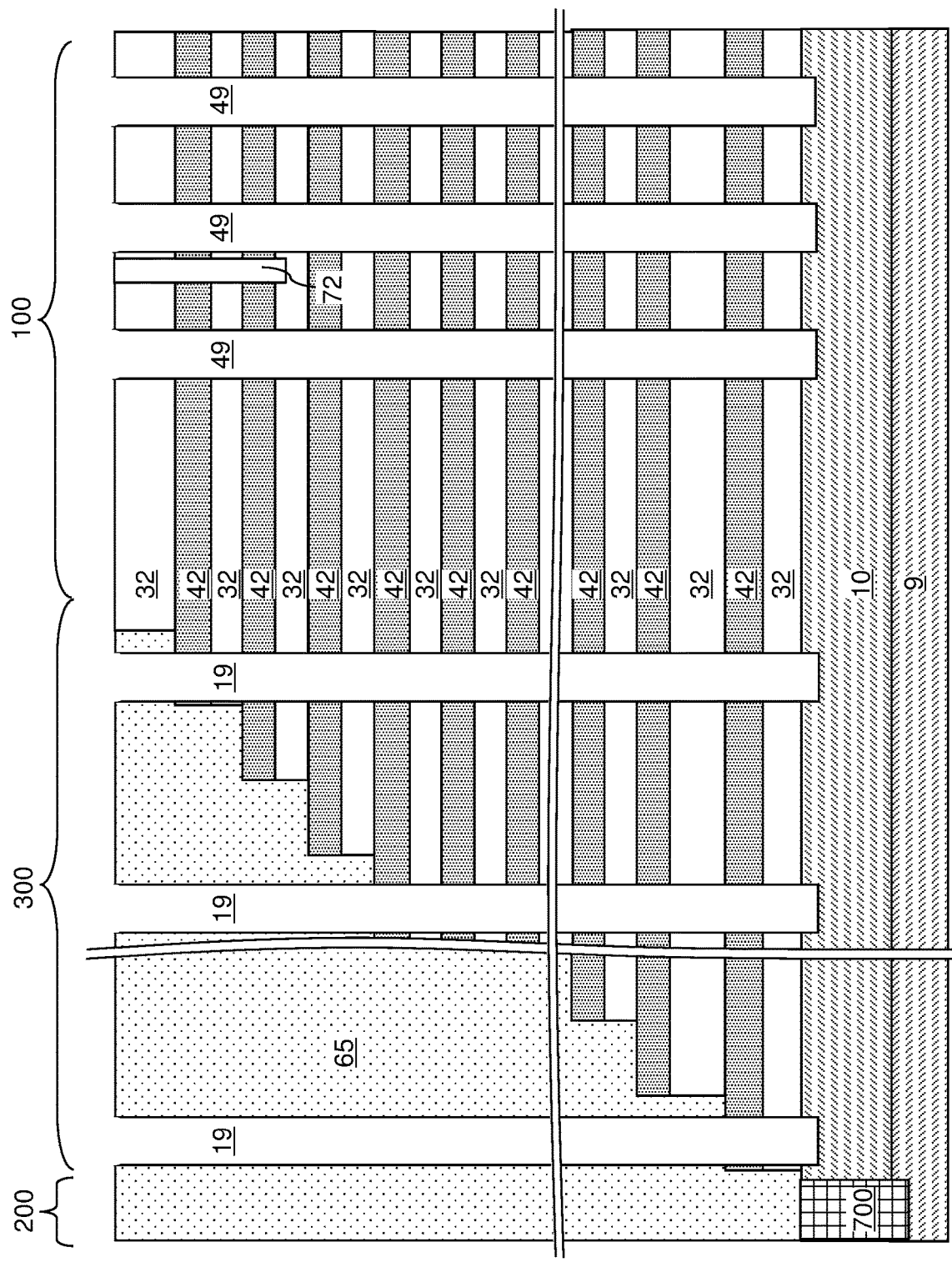
FIG. 4A is a schematic vertical cross-sectional view of the exemplary structure after formation of memory openings and support openings according to an embodiment of the present disclosure.
Figure 4B:
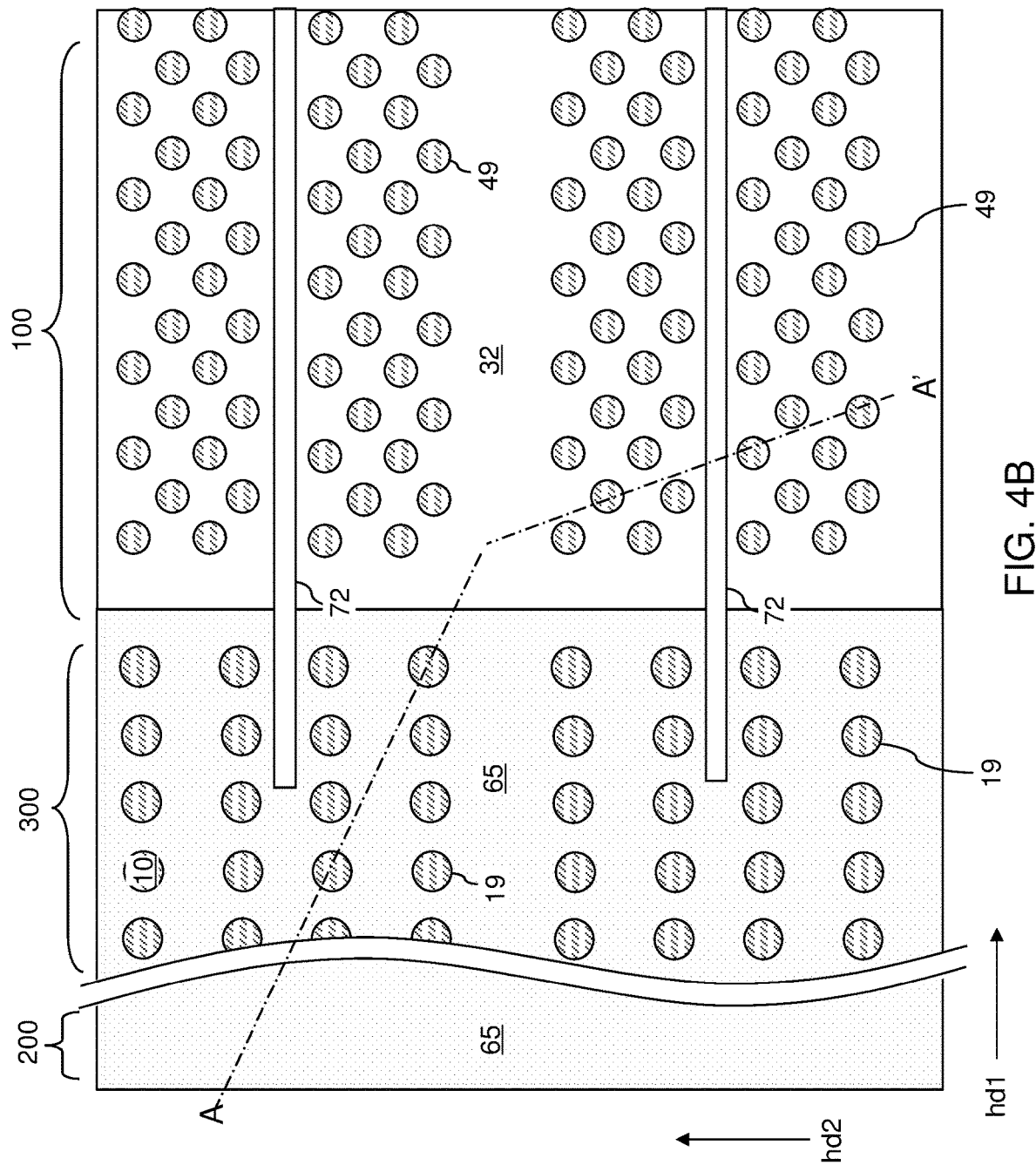
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Figure 5D:
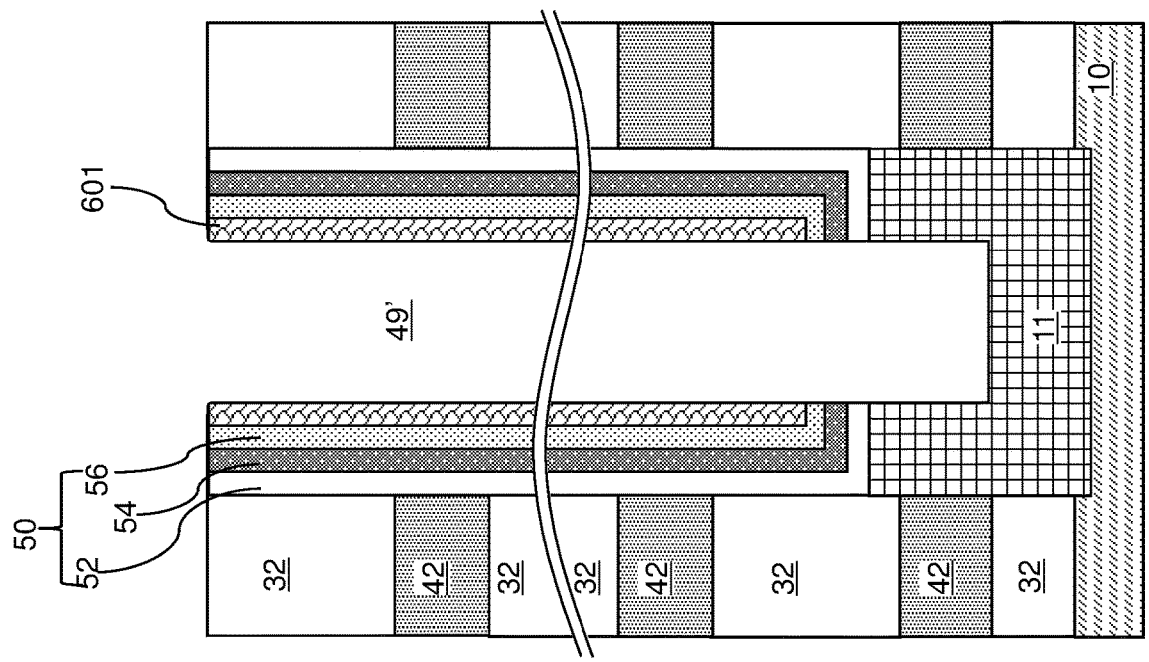
Figure 5C:
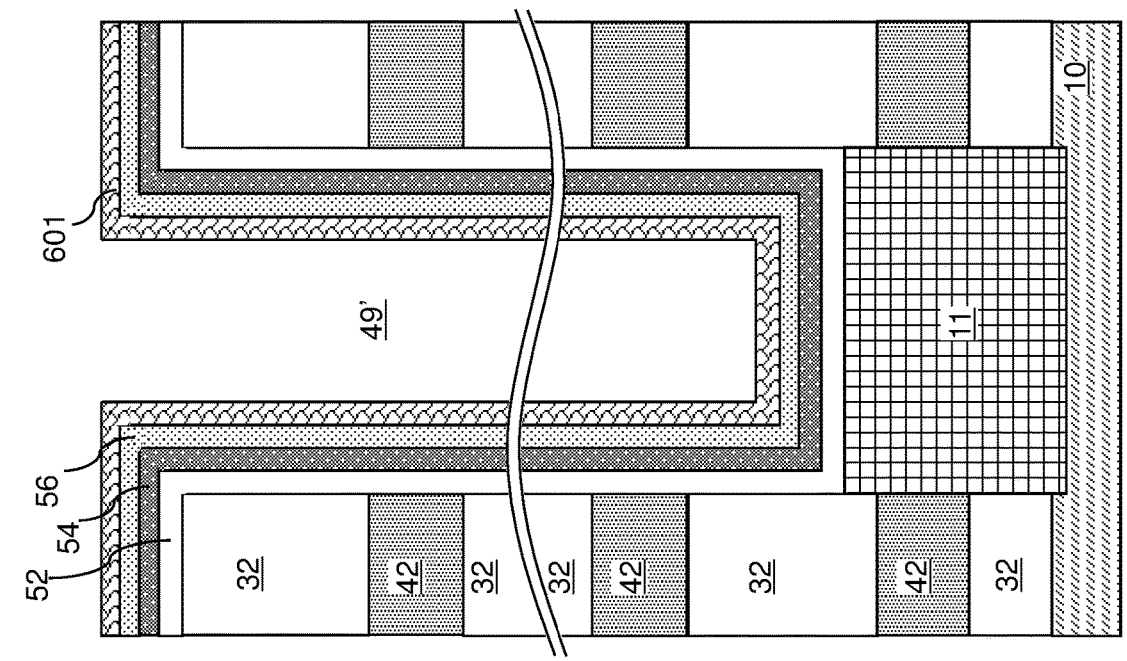

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The optional blocking dielectric layer 52 can include a single dielectric material layer or a stack of a plurality of dielectric material layers. The blocking dielectric layer 52 can be formed employing a conformal deposition process. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be deposited as a continuous material layer by a conformal deposition process such as a chemical vapor deposition process or an atomic layer deposition process. The memory material layer 54 includes a memory material, i.e., a material that can store data by changing a state of the material. For example, the memory material layer 54 may include a charge storage material such as silicon nitride, polysilicon, or a metallic material, a ferroelectric material that can store information in the form of a ferroelectric polarization direction, or any other memory material that can store data by altering its electrical resistivity.

The memory material layer 54 can be formed as a single memory material layer of homogeneous composition, or can include a stack of multiple memory material layers. In one embodiment, the memory material layer 54 may comprise an insulating charge trapping material, such as a silicon nitride layer or silicon nitride segments. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The dielectric material liner 56 includes a dielectric material. The dielectric material liner 56 can be formed on the memory material layer 54 employing a conformal deposition process. In one embodiment in which the memory material layer 54 is a charge storage layer, the dielectric material liner 56 comprises a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric material liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric material liner 56 can include a stack of a first silicon oxide layer, a silicon oxynitride layer, and a second silicon oxide layer, which is commonly known as an ONO stack. In one embodiment, the dielectric material liner 56 can include a silicon oxide layer that is substantially free of carbon or a silicon oxynitride layer that is substantially free of carbon. The thickness of the dielectric material liner 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (comprising portions of the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained in the final device if it comprises a semiconductor material.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62C can be deposited in the memory cavity 49' to fill any remaining portion of the memory cavity 49' within each memory opening. The dielectric core layer 62C includes a dielectric material such as silicon oxide or organosilicate glass. The dielectric core layer 62C can be deposited by a conformal deposition method such as low pressure chemical vapor deposition (LPCVD), or by a self-planarizing deposition process such as spin coating.

Figure 5H:
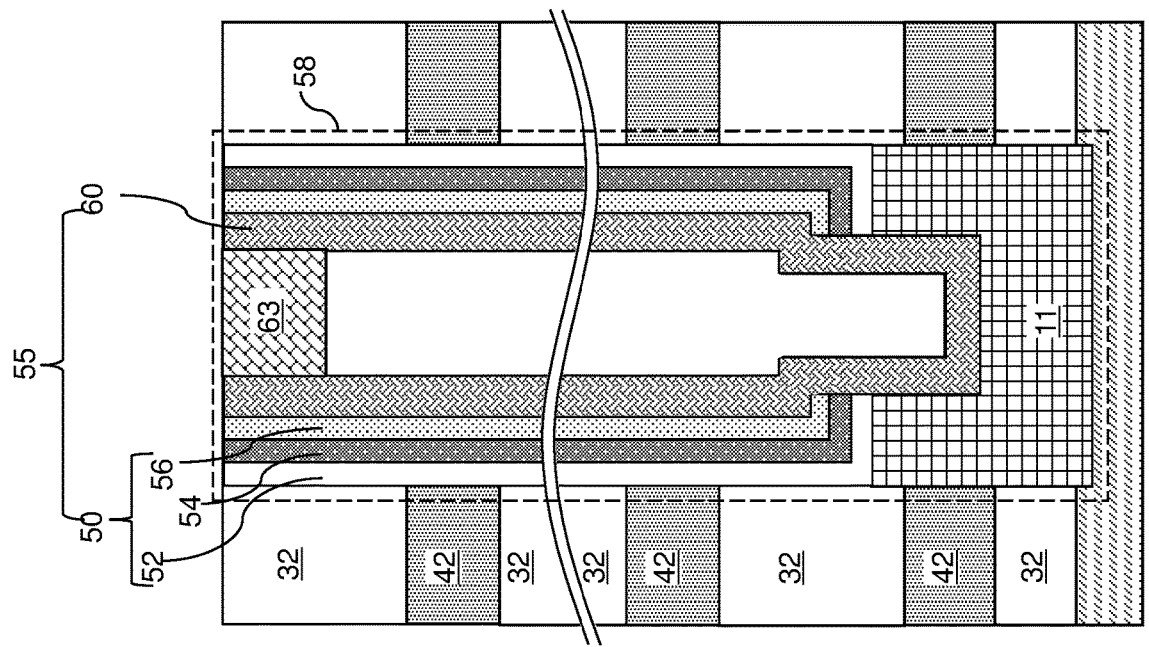
Figure 5G:
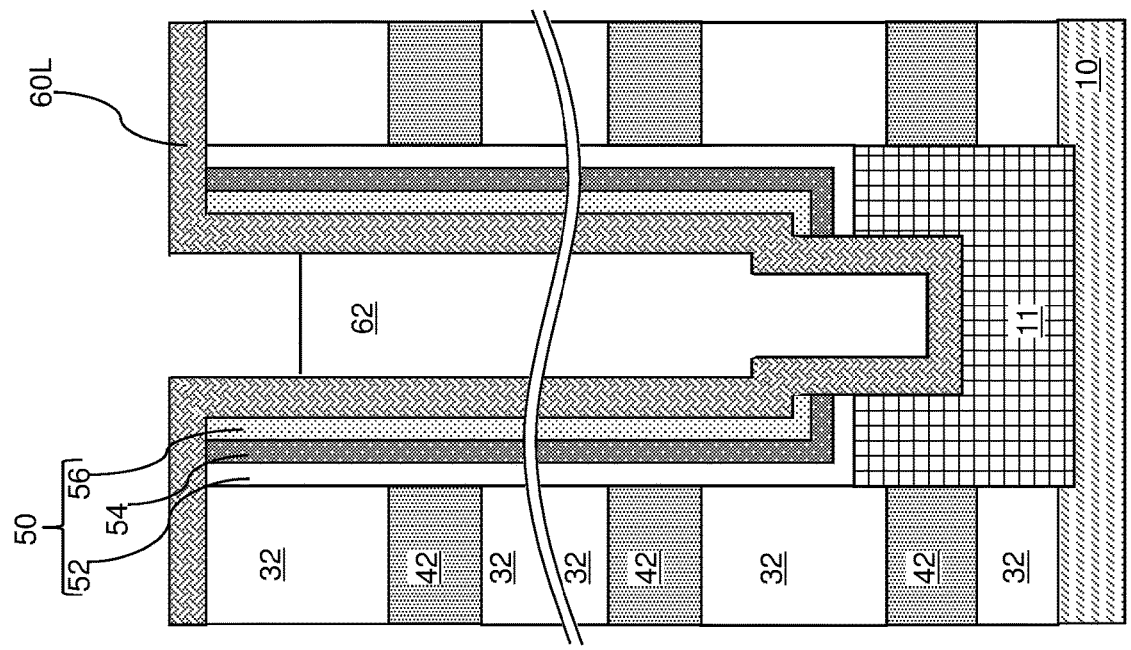

Referring to FIG. 5G, the horizontal portion of the dielectric core layer 62C can be removed, for example, by a recess etch process such that each remaining portions of the dielectric core layer 62C is located within a respective memory opening 49 and has a respective top surface below the horizontal plane including the top surface of the insulating cap layer 70. Each remaining portion of the dielectric core layer 62C constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or electrical polarization with a macroscopic retention time. In some embodiments, a blocking dielectric layer 52 may not be present in the memory film 50 at this step, and a backside blocking dielectric layer may be subsequently formed after formation of backside recesses. Furthermore, if the ferroelectric memory material layer 54 is used, then the liner 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements comprising portions of the memory material layer 54, and an optional blocking dielectric layer 52. Each combination of a pedestal channel portion 11 (if present), a memory stack structure 55, a dielectric core 62, and a drain region 63 (e.g., an entire set of material portions that fills a memory opening 49) is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (comprising portions of the memory material layer 54) may be formed on the blocking dielectric layer 52. In one embodiment, the vertical stack of memory elements comprises portions of a memory material layer 54 located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the memory material layer and the tunneling dielectric layer can be located between the memory material layer and the vertical semiconductor channel 60. A vertical NAND string can be formed through each memory opening upon subsequent replacement of the sacrificial material layers 42 with electrically conductive layers.

Figure 6:
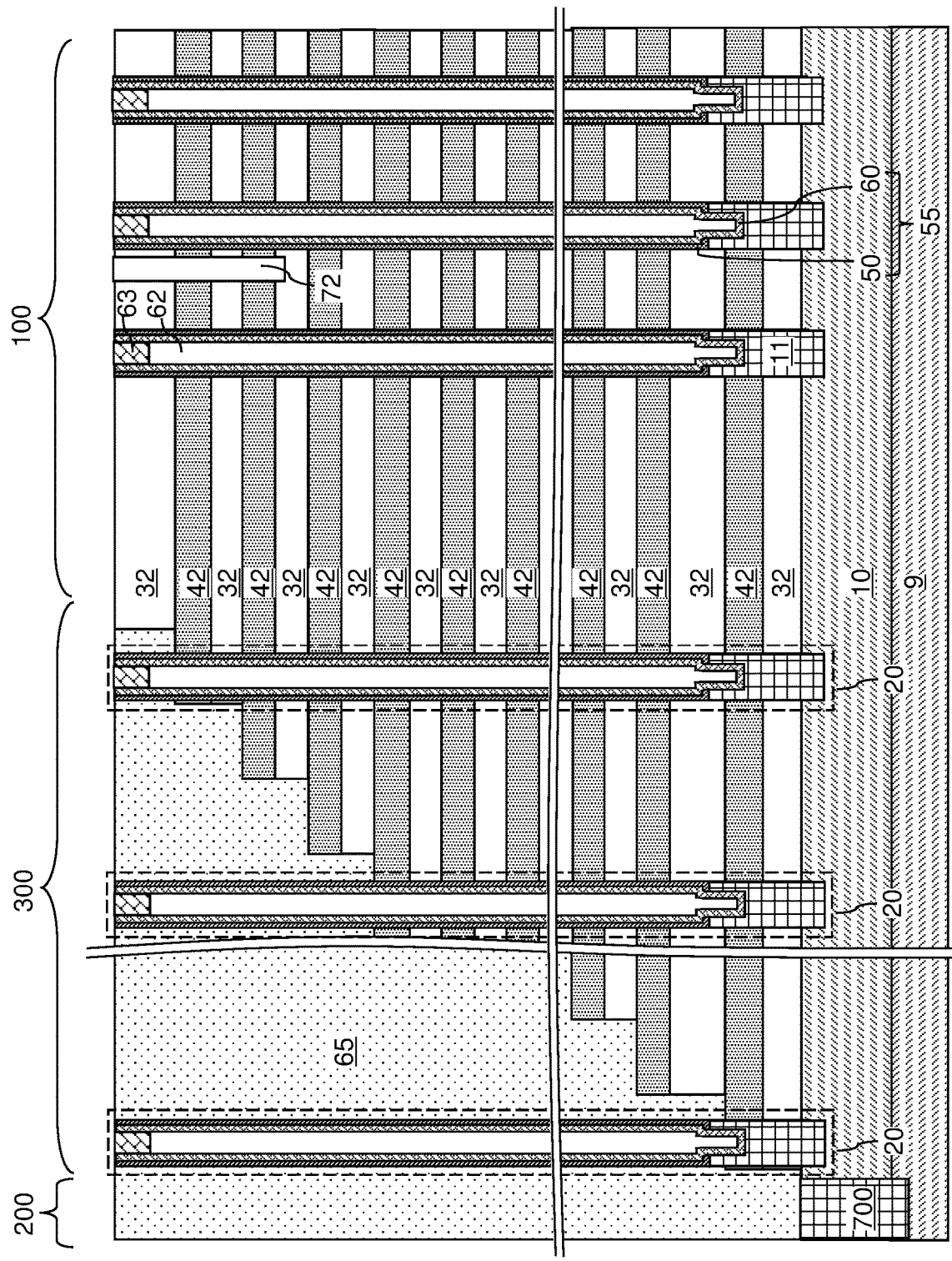
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions or ferroelectric regions (e.g., comprising portions of the memory material layer 54) laterally surrounding the dielectric material liner 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
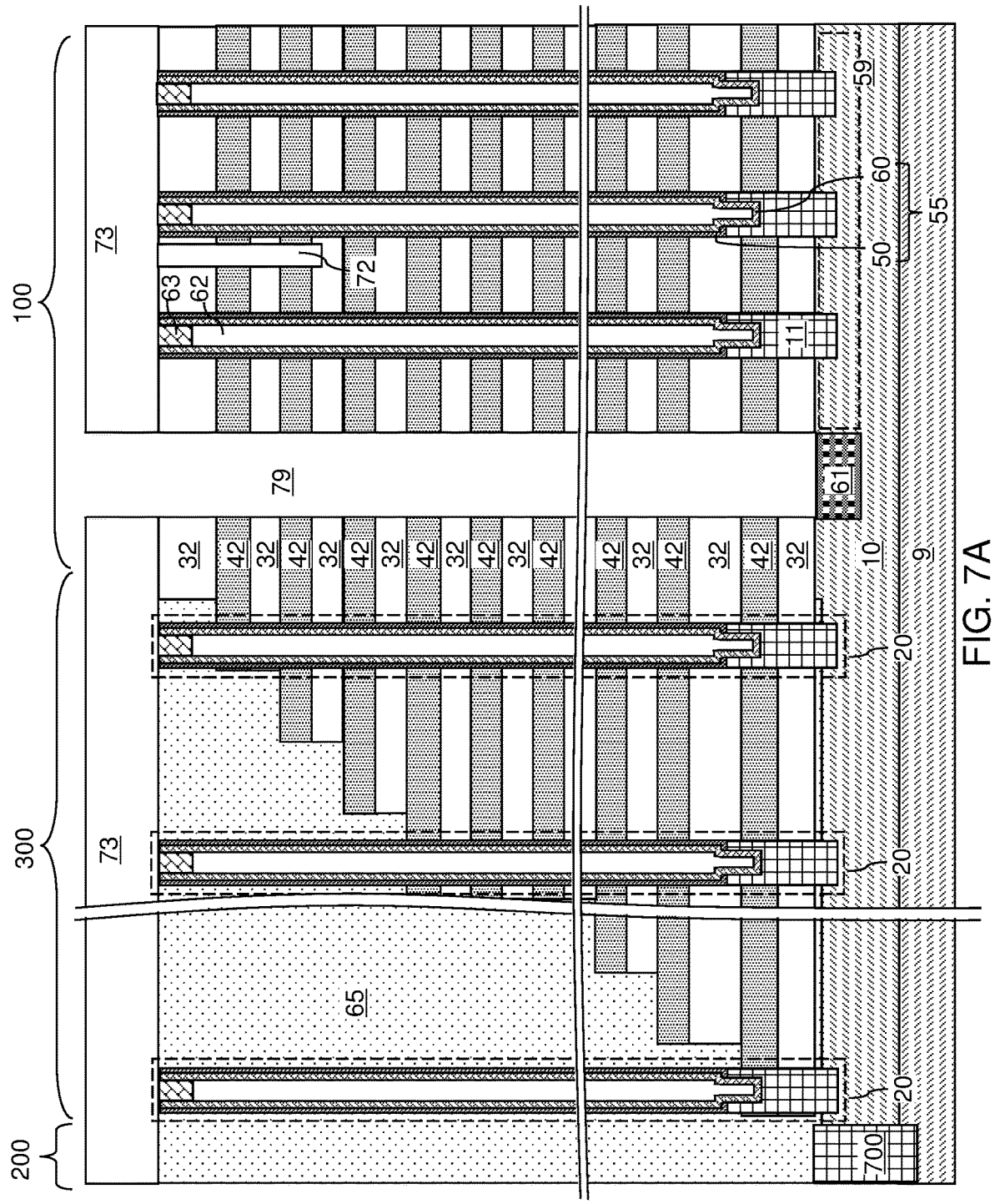
FIG. 7A is a schematic vertical cross-sectional view of the exemplary structure after formation of backside trenches according to an embodiment of the present disclosure.
Figure 7B:
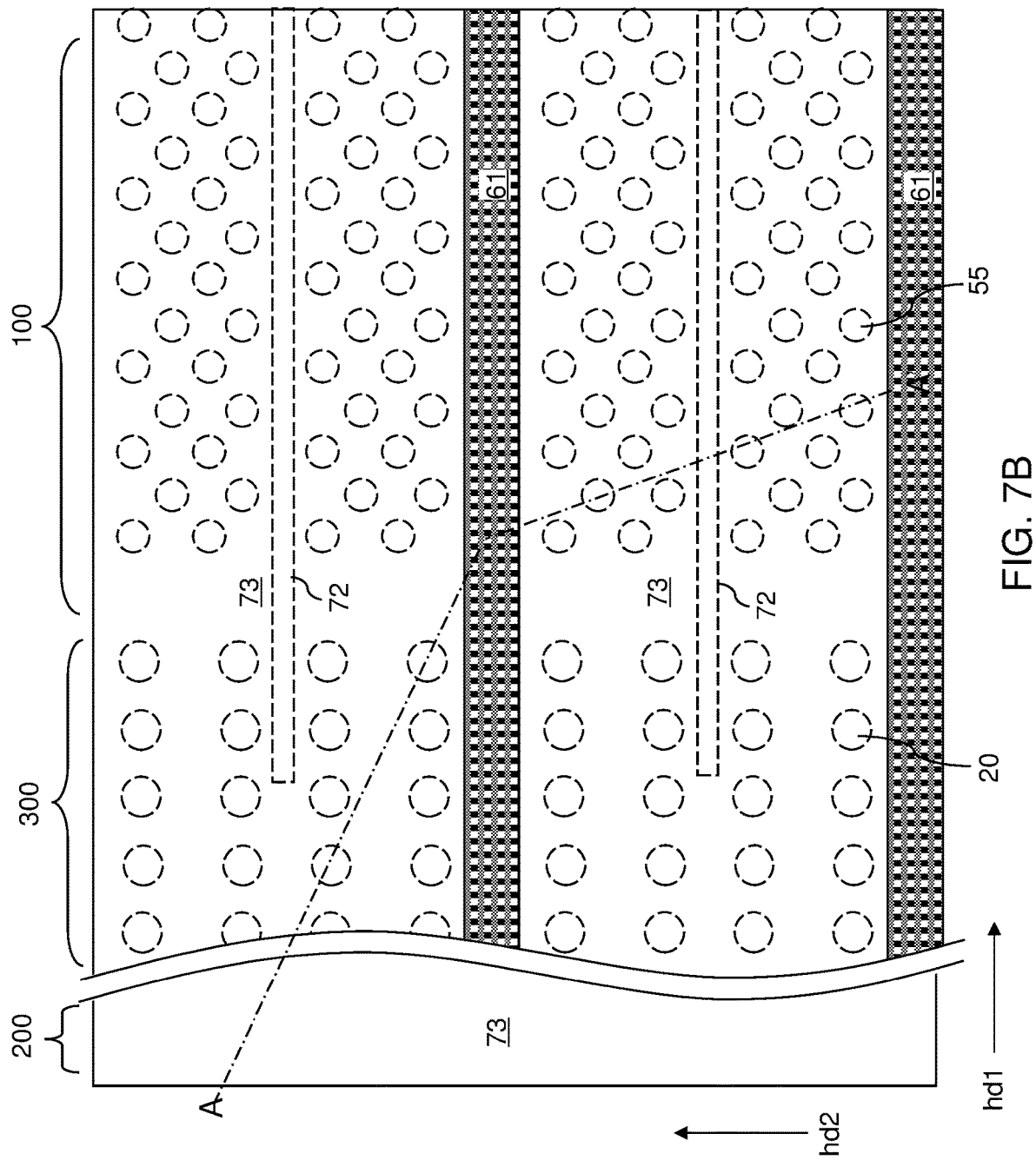
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

Figure 8:
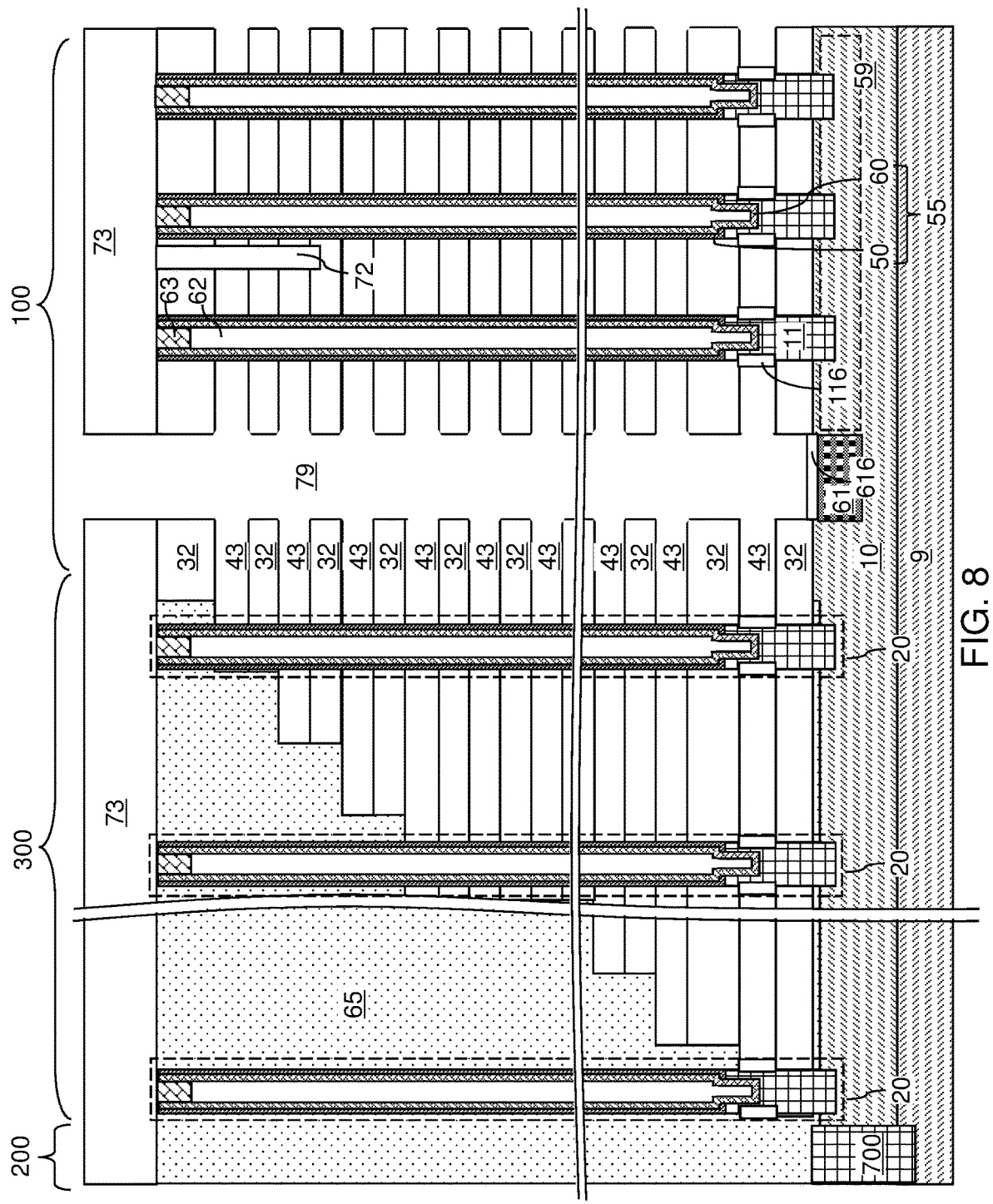
FIG. 8 is a schematic vertical cross-sectional view of the exemplary structure after formation of backside recesses according to an embodiment of the present disclosure.

Referring to FIGS. 8 and 9A, backside recesses 43 are formed by providing an isotropic etchant that etches a material of the sacrificial material layers 42 selective to a material of the insulating layers 32 into the backside trenches 79. The isotropic etchant selectively etches the second material of the sacrificial material layers 42 with respect to the first material of the insulating layers 32. The backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 comprising, and/or consisting essentially of, a dielectric metal oxide material can be optionally formed on physically exposed surfaces of the memory opening fill structures 58 and on physically exposed surfaces of the insulating layers 32 within the backside recesses 43 and the backside trenches 79. The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a first metallic component layer 461 and a second metallic component layer 462 can be deposited in the backside recesses 43. According to an aspect of the present disclosure, a first one of the first metallic component layer 461 and the second metallic component layer 462 comprises and/or consists essentially of a first metal element selected from Ta or Ti. A second one of the first metallic component layer 461 and the second metallic component layer 462 comprises and/or consists essentially of a second metal element that is one of Al or Mo or a combination of Al and Mo. Preferably, the first metallic component layer 461 comprises and/or consists essentially of Ta or Ti, and the second metallic component layer 462 comprises and/or consists essentially of a second metal element that is one of Al or Mo, or a combination of Al and Mo. Preferably, the first metallic component layer 461 and the second metallic component layer 462 contain less than 10 atomic percent total of oxygen and nitrogen, such as 0 to 5 atomic percent of oxygen and nitrogen.

In one embodiment, the first metal element of the first metallic component layer 461 comprises Ti and the second metal element of the second metallic component layer 462 comprises Al. In another embodiment, the first metal element of the first metallic component layer 461 comprises Ta and the second metal element of the second metallic component layer 462 comprises Mo. In yet another embodiment, the first metal element of the first metallic component layer 461 comprises Ti and the second metal element of the second metallic component layer 462 comprises Mo or a combination of Al and Mo.

The first metallic component layer 461 can be formed by a first conformal deposition process such as a chemical vapor deposition process or an atomic layer deposition process. The thickness of the first metallic component layer 461 may be in a range from 0.3 nm to 3 nm, such as from 0.6 nm to 2 nm, although lesser and greater thicknesses may also be employed. The second metallic component layer 462 can be formed by a second conformal deposition process such as a chemical vapor deposition process or an atomic layer deposition process. The thickness of the second metallic component layer 462 may be in a range from 0.3 nm to 3 nm, such as from 0.6 nm to 2 nm, although lesser and greater thicknesses may also be employed.

Referring to FIG. 9D, portions of at least the second metallic component layer 462 can be anisotropically etched from within volumes of the backside trenches 79. If the second metallic component layer 462 comprises an aluminum layer, then a chlorine based plasma etch, such as silicon tetrachloride or carbon tetrachloride etch may be used. Optionally, the first metallic component layer 461 can also be anisotropically etched from within volumes of the backside trenches 79 after etching of the second metallic component layer 462. The first metallic component layer 461 can be etched using any suitable Ti or Ta etching method until dielectric surfaces are physically exposed around each of the backside trenches 79. In case the backside blocking dielectric layer 44 is employed, the dielectric surfaces comprise surface of the backside blocking dielectric layer 44 (which is conformally deposited on physically exposed surfaces of the backside recesses 43 and the backside trenches 79 prior to deposition of the first metallic component layer 461 and the second metallic component layer 462). In case the backside blocking dielectric layer 44 is not employed or vertically-extending portions of the backside blocking dielectric layer 44 are collaterally etched during the anisotropic etch process, the dielectric surfaces comprise surface of the insulating layers 32. Alternatively, the first metallic component layer 461 may be retained within volumes of the backside trenches 79 and not etched during this step.

Referring to FIG. 9E, a thermal anneal process can be performed at an elevated temperature to induce reaction between the first metal element within the first metallic component layer 461 and the second metal element within the second metallic component layer 462. A metallic barrier liner 46A including an intermetallic compound comprising the first metal element and the second metal element can be formed in each of the backside recesses by annealing the first metallic component layer 461 and the second metallic component layer 462 at the elevated temperature, at which the first metal element and the second metal element form an intermetallic compound. The metallic barrier liners 46A are formed within volumes of the backside recesses 43 and outside volumes of the backside trenches 79.

According to an aspect of the present disclosure, the metallic barrier liners 46A include an intermetallic compound of at least two elements that includes a first metal element selected from Ta or Ti, and a second metal element that is one or both of Al and/or Mo. In one embodiment, the first metal element is present within each of the metallic barrier liners 46A at an atomic percentage in a range from 10% to 65%, and the second metal element is present within each of the metallic barrier liners 46A at an atomic percentage in a range from 20% to 75%. In one embodiment, the sum of the atomic percentage of the first metal element and the atomic percentage of the second metal element within each of the metallic barrier liners 46A can be in a range from 90% to 100%, such as 95% to 100%. The metallic barrier liners 46A include less than 10 atomic percent total of oxygen and nitrogen, such as 0% to 5% of oxygen and nitrogen.

In one embodiment, each metallic barrier liner 46A may comprise a combination of Al and Mo. In other words, each metallic barrier liner 46A may comprise the first metal element, Al, and Mo.

In one embodiment, the first metal element comprises Ti and the second metal element comprises Al. Ti—Al intermetallics can exist in different phases having different Ti to Al atomic ratios. Exemplary Ti—Al intermetallic phases include, for example, a $TiAl_3$ phase, a TiAl phase, and a $Ti_3Al$ phase. Resistivity of the Ti—Al intermetallics may be as low as about 22 µOhm-cm, and generally about 22 µOhm-cm to 80 µOhm-cm. Generally, Ti—Al intermetallics have highly textured crystalline microstructure for different compositions, and provide lower electrical resistivity and lower grain boundary diffusion compared to TiN barrier liners.

In another embodiment, the first metal element comprises Ta and the second metal element comprises Mo. In one embodiment, the metallic barrier liners 46A have a material composition of $Ta_\alpha Mo_{(1-\alpha)}$, in which α is in a range from 0.1 to 0.65, such as from 0.2 to 0.5. Resistivity of the Ta—Mo intermetallics may be in a range from about 10 µOhm-cm to about 60 µOhm-cm. Ta—Mo intermetallics have highly textured crystalline microstructure for different compositions, and provide lower electrical resistivity and lower grain boundary diffusion compared to TiN barrier liners.

Generally, the product of the electron mean free path λ and bulk electrical resistivity ρ can be employed as a figure of merit for an electrically conductive material. Table 1 shows the λρ product for elemental metals, and Table 2 shows the λρ product for the intermetallics that may be used in embodiments of the present disclosure.

TABLE 1

λρ products for common elemental metals

| metal | λρ product (in units of $10^{-16}$ $\Omega m^2$) |
| --- | --- |
| W | 82 |
| Co | 60 |
| Mo | 59 |
| Ru | 44 |
| Cu | 65 |
| Ni | 42 |

TABLE 2

λρ products for the intermetallics of embodiments of the present disclosure

| intermetallic compound | λρ product (in unites of $10^{-16}$ $\Omega m^2$) |
| --- | --- |
| $TiAl_3$ | 50 |
| TiAl | 45 |
| $Ti_3Al$ | 38 |
| MoTa | 12 |
| $Mo_3Ti$ | 33 |

Comparison of Table 1 and Table 2 shows that the λρ product for the intermetallic compound of embodiments of the present disclosure can be lower than the λρ product of common elemental metals, and thus, can be effective in providing low electrical resistivity diffusion barrier layers.

Generally, an intermetallic compound consisting of two or more of a metal comprising Ti or Ta, and at least one metal comprising Al and/or Mo can be employed for the metallic barrier liners 46A. A small atomic percentage of nitrogen and/or oxygen (e.g., less than 10% total, such as less than 5% total, for example less than 2% each, such as less than 1% each, and/or 0 to 0.5% each) may be present within the metallic barrier liners 46A. Thus, the metallic barrier liners 46A are not metal nitride or metal oxide barrier liners. The intermetallic compounds of embodiments of the present disclosure can provide electrical resistivity that is lower than electrical resistivity of conventional metallic nitride barrier materials (such as TiN, TaN, and/or WN) by a factor of 6 or more. Further, the intermetallic compounds of embodiments of the present disclosure can provide high etch resistance and good blocking properties against fluorine atoms and chlorine atoms.

Referring to FIG. 9F, metallic fill material layers 46B can be formed at least in the recesses metallic barrier liners 46A. In one embodiment shown in FIG. 9F, the metallic fill material layers 46B may be deposited by performing a selective metal growth process that grows a metallic fill material from physically exposed surfaces of the metallic barrier liners 46A in the backside recesses 43, while suppressing growth of the metallic fill material from dielectric surfaces. In one embodiment, the metallic fill material can be deposited by a conformal selective deposition method, which can be, for example, chemical vapor deposition (CVD) or atomic layer deposition (ALD). In one embodiment, the metallic fill material layers 46B can consist essentially of at least one elemental metal. The at least one elemental metal of the metallic fill material layers 46B can be selected from W, Ta, Mo, Ru, Co or Ti. In one embodiment, the metallic fill material layers 46B can consist essentially of a single elemental metal. In one embodiment, the metallic fill material layers 46B comprise tungsten that can be deposited employing a fluorine-containing precursor gas such as $WF_6$. In one embodiment, the metallic fill material layers 46B can be tungsten layers including a residual level of fluorine atoms as impurities. The metallic fill material layers 46B can be spaced from the insulating layers 32 and the memory stack structures 55 by the metallic barrier liners 46A, which block diffusion of fluorine atoms and chlorine atoms therethrough. In one embodiment, portions of the metallic fill material layers 46B can protrude into peripheral regions of each backside trench 79.

Alternatively, the metallic fill material layers 46B may be deposited by performing a non-selective metal growth process that fills the remaining portions of the backside recesses 43 and at least a portion of the backside trenches 79. If the first metallic component layer 461 are not etched during the step shown in FIG. 9D, then the metallic fill material layers 46B may be deposited by performing a non-selective metal growth process on the metallic barrier liners 46A located in the backside recesses 43 and on the first metallic component layer 461 remaining in the backside trenches 79.

A plurality of electrically conductive layers 46 can be formed in the plurality of backside recesses 43. Each electrically conductive layer 46 includes a metallic barrier liner 46A and a metallic fill material layer 46B that are located between a vertically neighboring pair of dielectric material layers such as a pair of insulating layers 32.

Each sacrificial material layer 42 can be replaced with an electrically conductive layer 46. A backside cavity 79' is present in the portion of each backside trench 79 that is not filled with the backside blocking dielectric layer 44 and the electrically conductive layers 46. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Referring to FIGS. 9G and 10, portions of the metallic fill material layers 46B located within the backside trenches 79 can be etched back employing at least one etch process, which may include an isotropic wet etch process, an anisotropic dry etch process, or a combination thereof. If the first metallic component layer 461 is not etched during the step shown in FIG. 9D, then the remaining portions of the first metallic component layer 461 is removed from the backside trench 79 together with or sequentially after etching the metallic fill material layers 46B. For example, if both layer 461 and layers 46B both comprise tungsten, then they may be etched during the same etching step. Alternatively, if layer 461 comprises titanium and layers 46B comprise tungsten, then they may be etched sequentially.

Each electrically conductive layer 46 can comprise a conductive sheet including as many number of openings therethrough as the total number of memory opening fill structures 58 and the support pillar structures 20 that extend through the respective electrically conductive layer 46. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 11A:
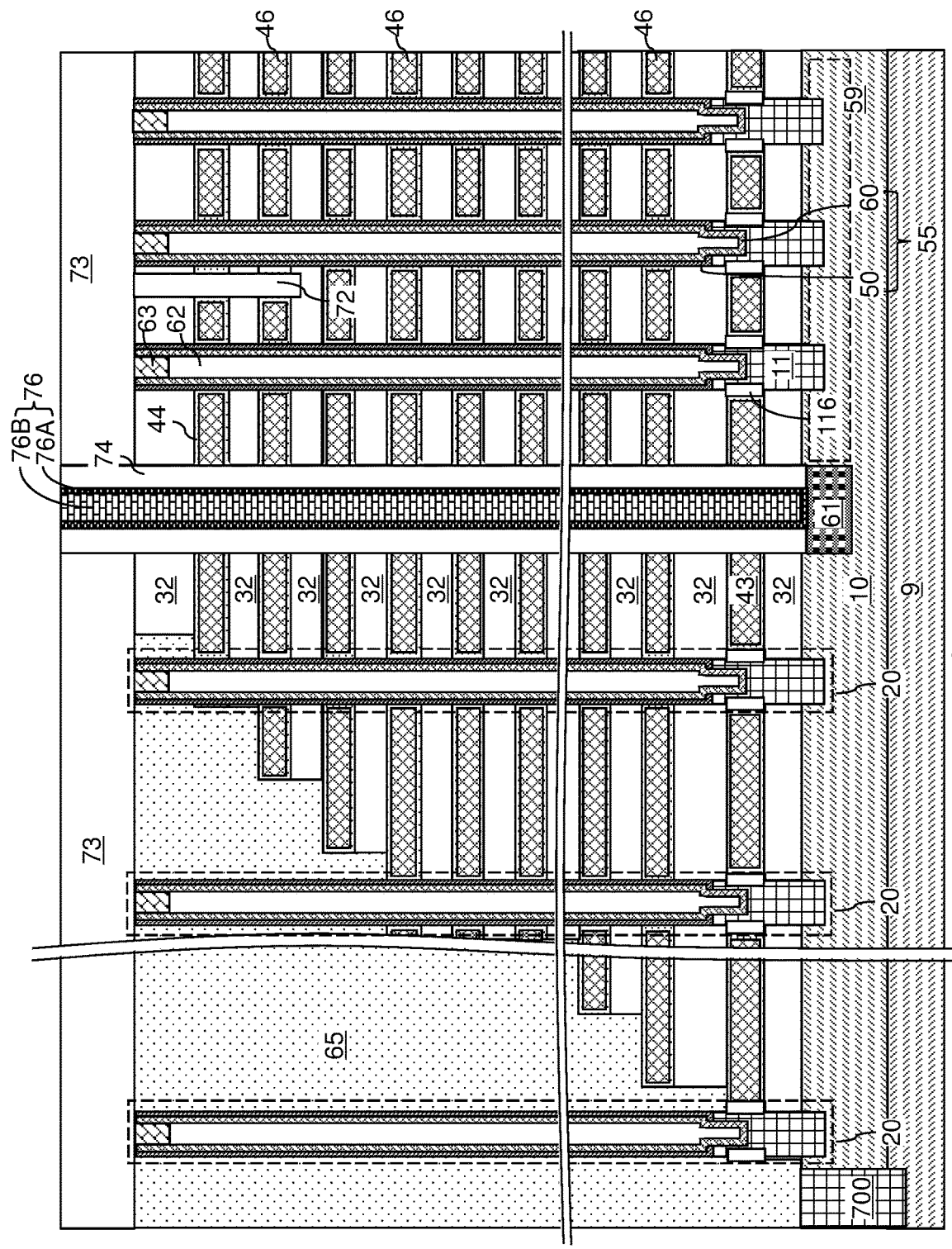
FIG. 11A is a schematic vertical cross-sectional view of the exemplary structure after formation of an insulating spacer and a backside contact structure according to an embodiment of the present disclosure.
Figure 11B:
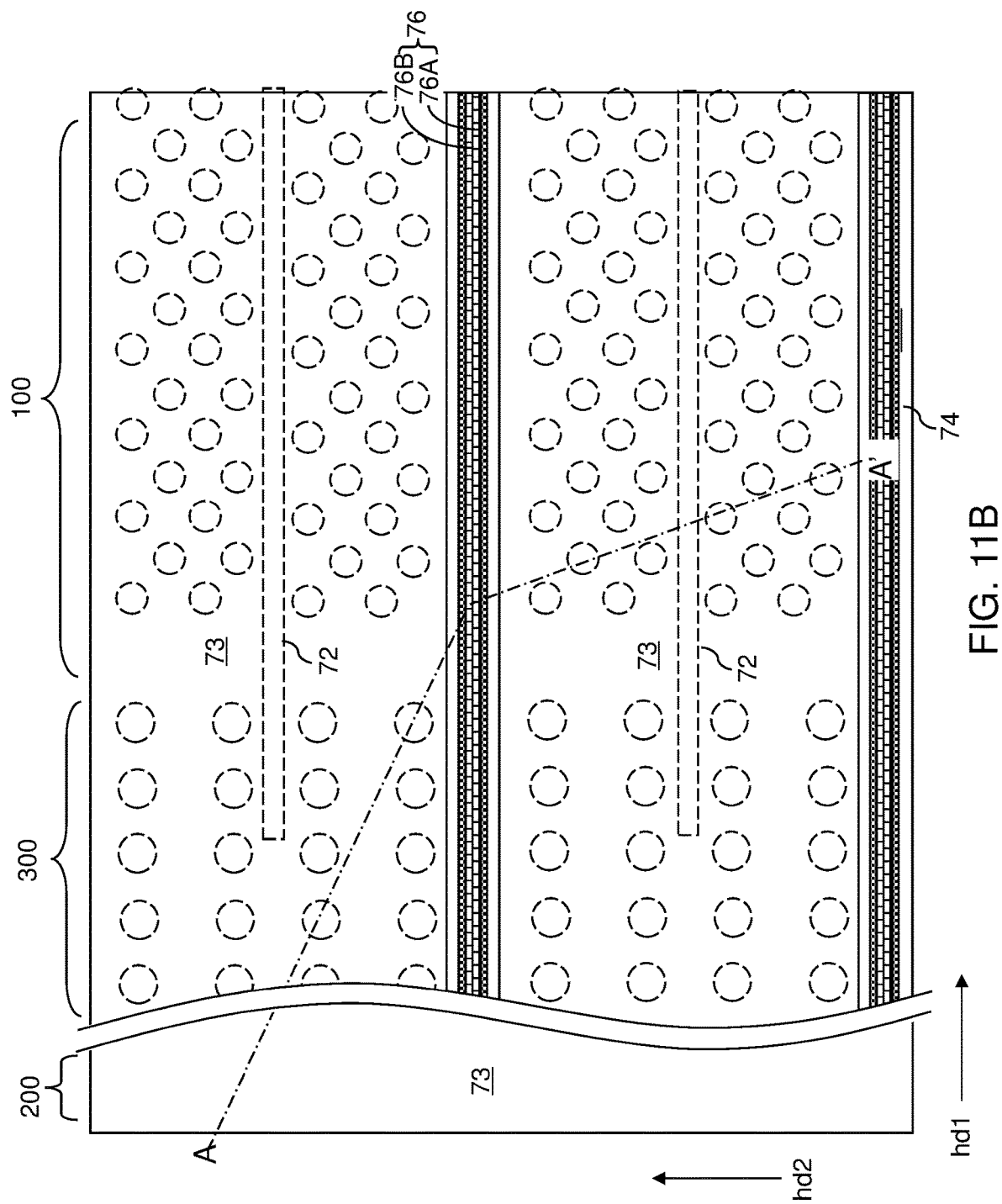
FIG. 11B is a partial see-through top-down view of the exemplary structure of FIG. 11A. The vertical plane A-A' is the plane of the schematic vertical cross-sectional view of FIG. 11A.

Referring to FIGS. 11A and 11B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 12A:
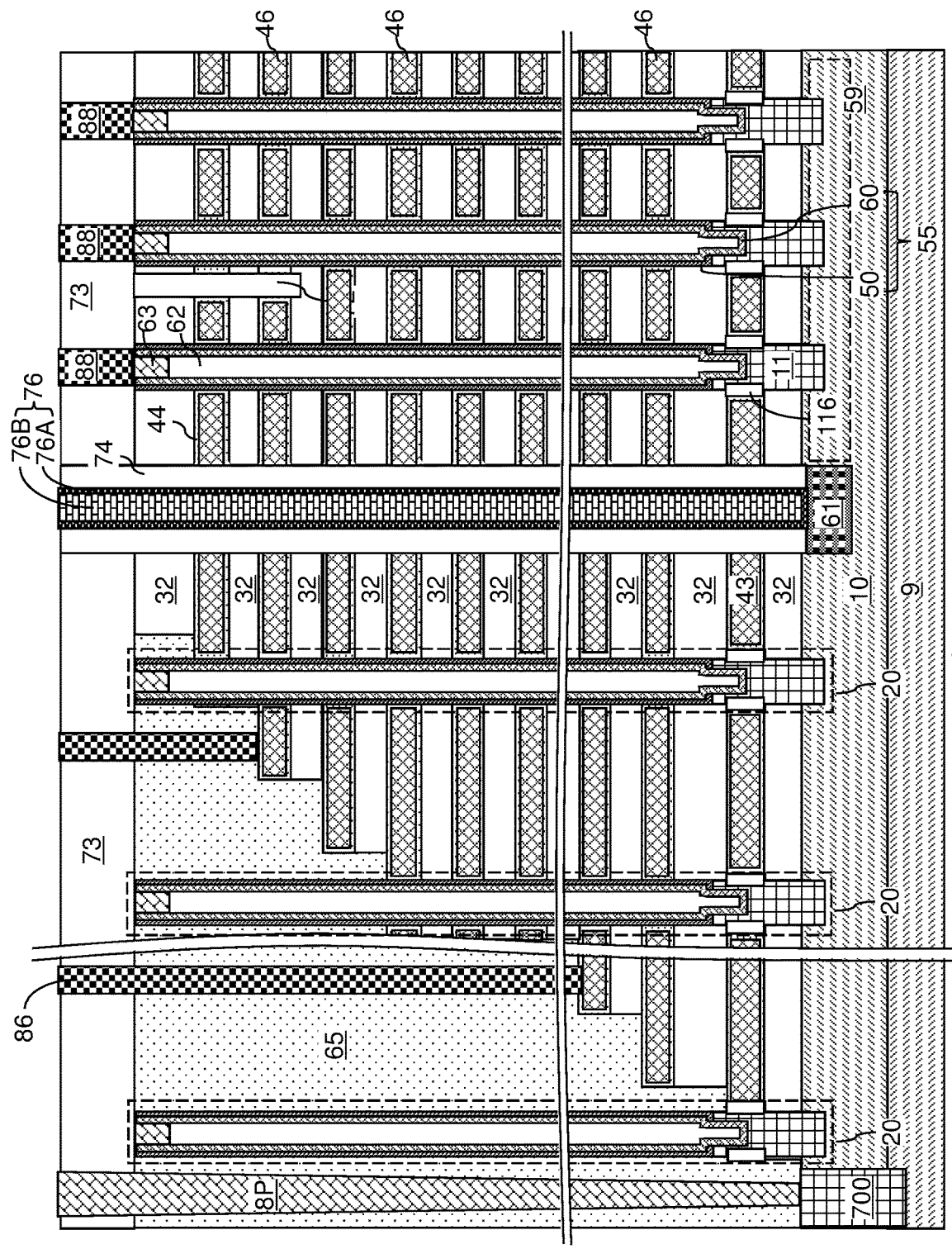
FIG. 12A is a schematic vertical cross-sectional view of the exemplary structure after formation of additional contact via structures according to an embodiment of the present disclosure.
Figure 12B:
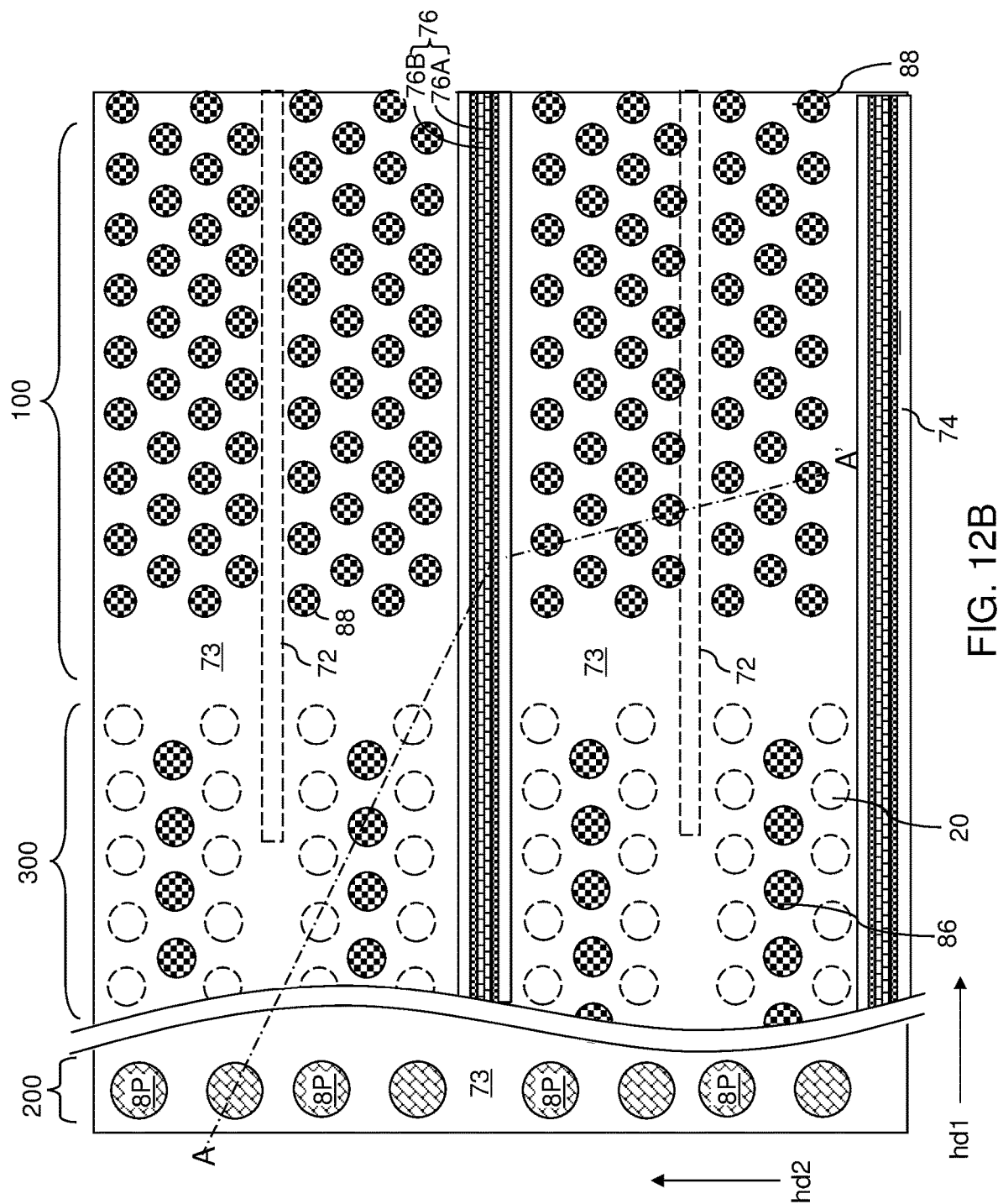
FIG. 12B is a top-down view of the exemplary structure of FIG. 12A. The vertical plane A-A' is the plane of the schematic vertical cross-sectional view of FIG. 12A.
Figure 12C:
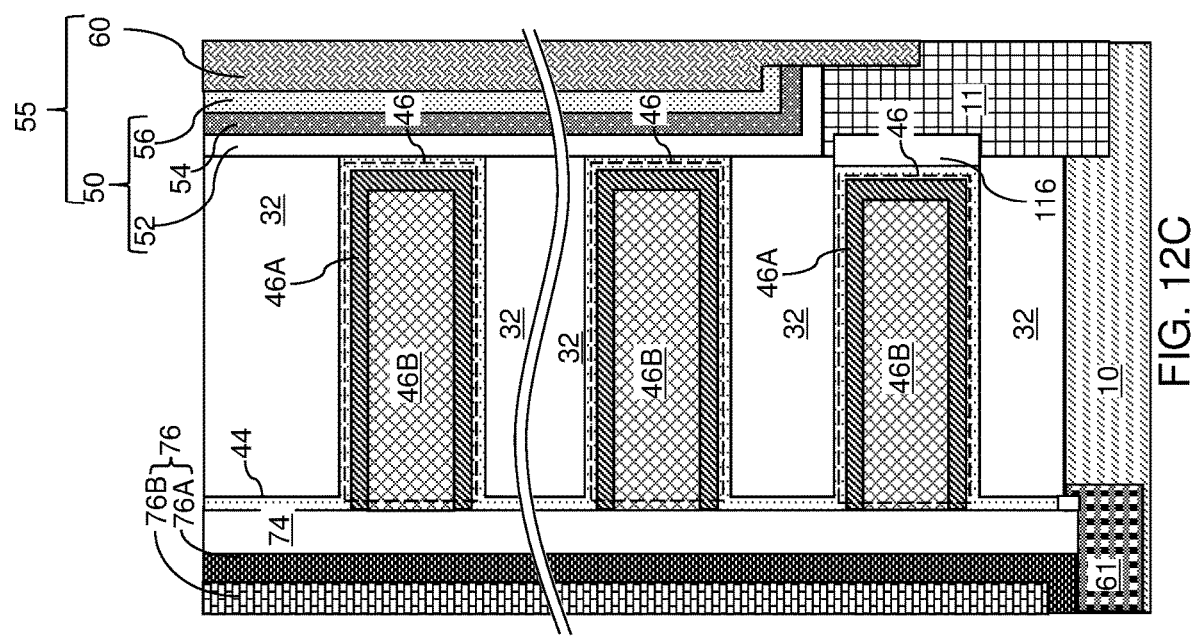
FIG. 12C is a magnified vertical cross-sectional view of a region of the exemplary structure of FIG. 12A.

Referring to FIGS. 12A-12C, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The exemplary structure may be modified into an alternative configuration in which the backside blocking dielectric layer 44 is omitted. Specifically, in the alternative configuration of the exemplary structure, the blocking dielectric layer 52 formed at the processing steps of FIG. 5C is replaced with a layer stack including a dielectric metal oxide blocking dielectric layer 501 comprising a dielectric metal oxide material (e.g., aluminum oxide) and a silicon oxide blocking dielectric layer 502. The dielectric metal oxide blocking dielectric layer 501 in a memory opening fill structure 58 is formed directly on a sidewall of a respective memory opening 49, and the dielectric metal oxide blocking dielectric layer 501 in a support pillar structure 20 is formed directly on a sidewall of a respective support opening 19. Each silicon oxide blocking dielectric layer 502 can be formed on an inner sidewall of a respective one of the dielectric metal oxide blocking dielectric layer 501.

A memory material layer 54 can be formed over the dielectric metal oxide blocking dielectric layer 501 and the silicon oxide blocking dielectric layer 502 within each of the memory openings 49 and the support openings 19. Each memory material layer 54 can comprise a respective vertical stack of memory elements, as described above. A vertical semiconductor channel 60 can be formed over the memory material layer 54 within each of the memory openings 49 and within each of the support openings 19. A drain region 63 contacting a top end of the vertical semiconductor channel 60 can be formed within each of the memory openings 49 and within each of the support openings 19. Subsequently, the processing steps of FIGS. 7A and 7B, and 8 can be performed.

FIGS. 13A-13F are sequential vertical cross-sectional views of a region of an alternative embodiment of the exemplary structure during formation of electrically conductive layers 46 according to an embodiment of the present disclosure.

Referring to FIG. 13A, the alternative configuration of the exemplary structure is illustrated at a processing step that corresponds to the processing step of FIGS. 8 and 9A.

Referring to FIG. 13B, the alternative configuration of the exemplary structure is illustrated at a processing step that corresponds to the processing step of FIG. 9C.

Referring to FIG. 13C, the alternative configuration of the exemplary structure is illustrated at a processing step that corresponds to the processing step of FIG. 9D.

Referring to FIG. 13D, the alternative configuration of the exemplary structure is illustrated at a processing step that corresponds to the processing step of FIG. 9E.

Figures 13E, 13F:
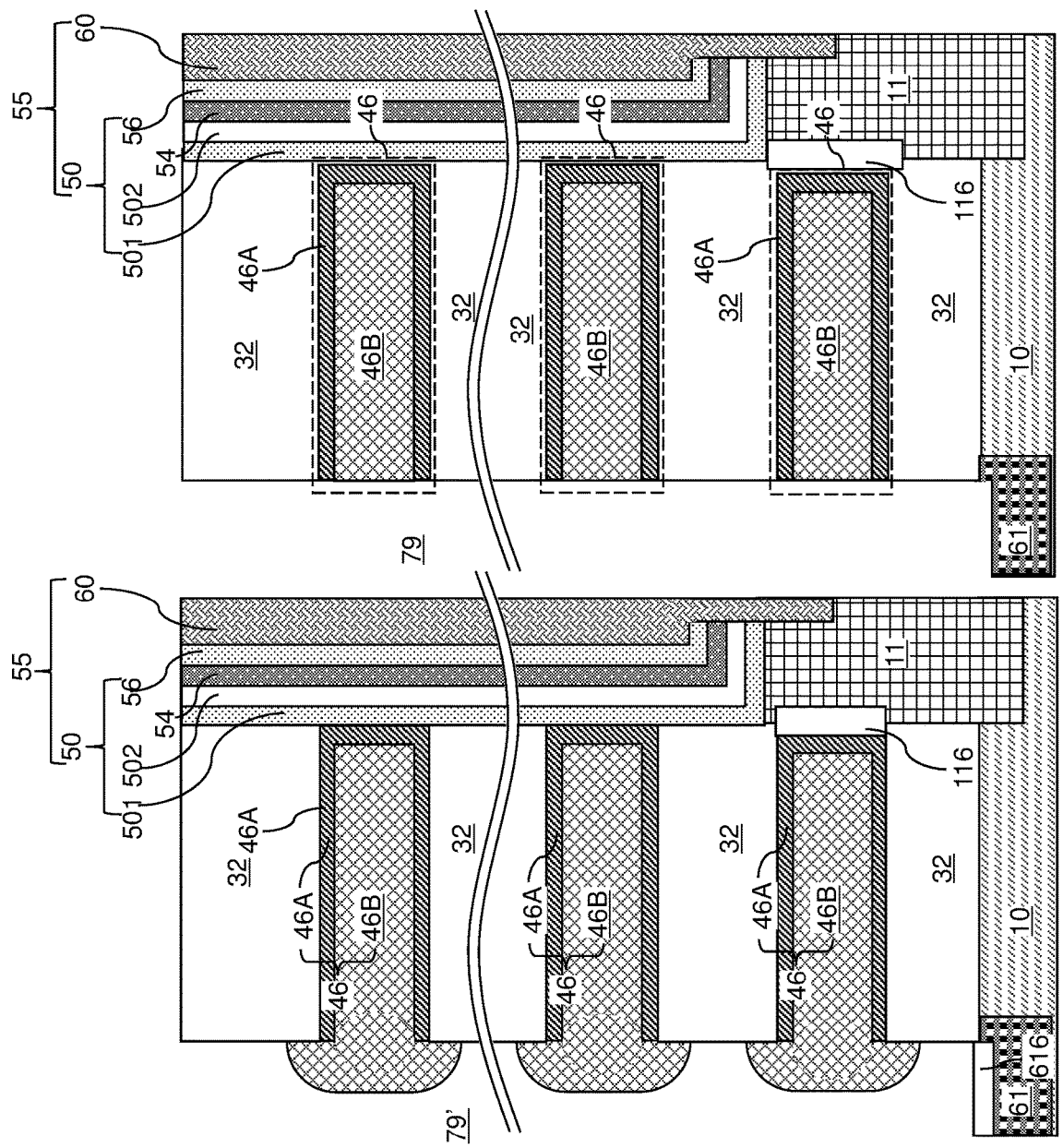

Referring to FIG. 13E, the alternative configuration of the exemplary structure is illustrated at a processing step that corresponds to the processing step of FIG. 9F.

Figure 10A:
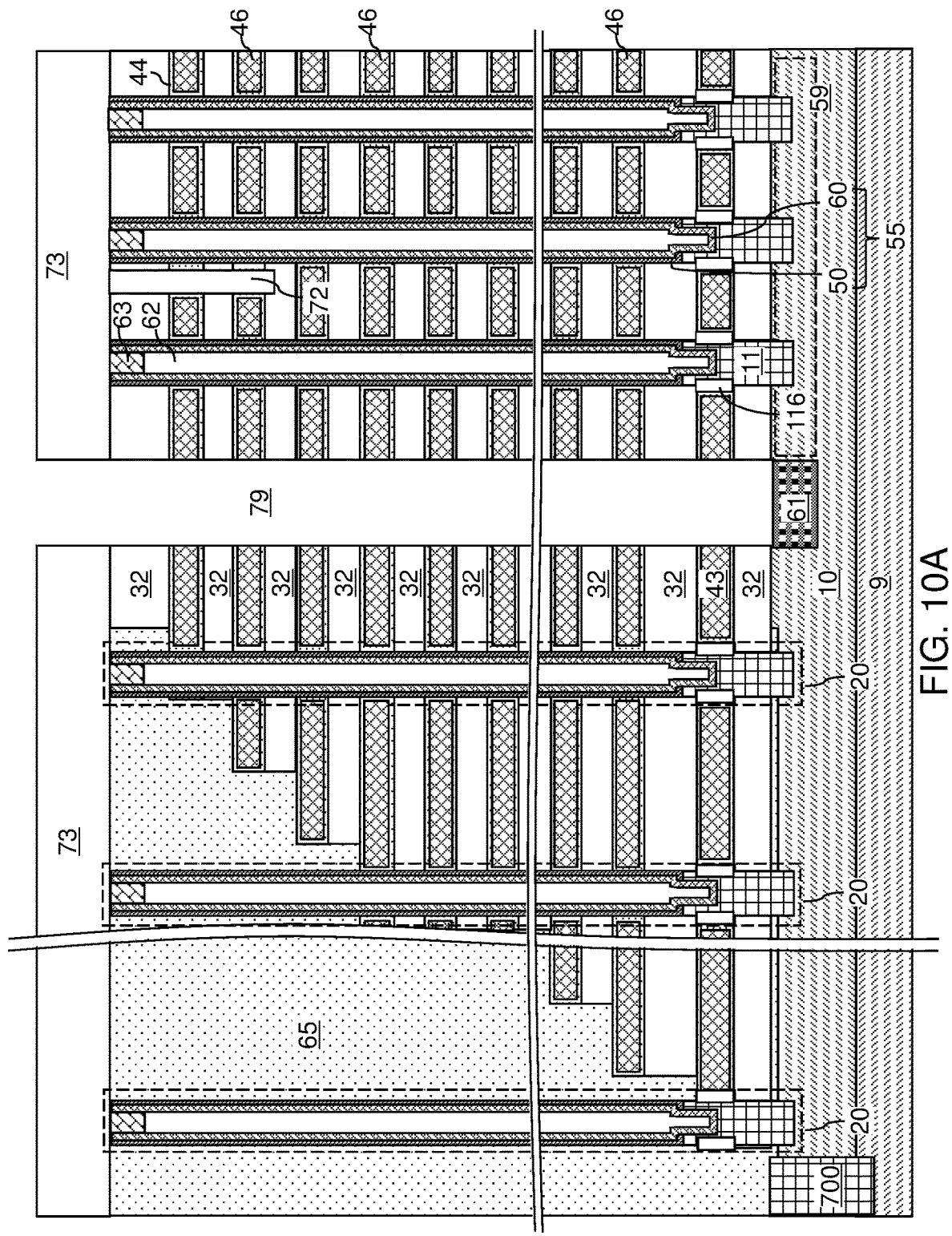
FIG. 10A is a schematic vertical cross-sectional view of the exemplary structure at the processing step of FIG. 9D.
Figure 10B:
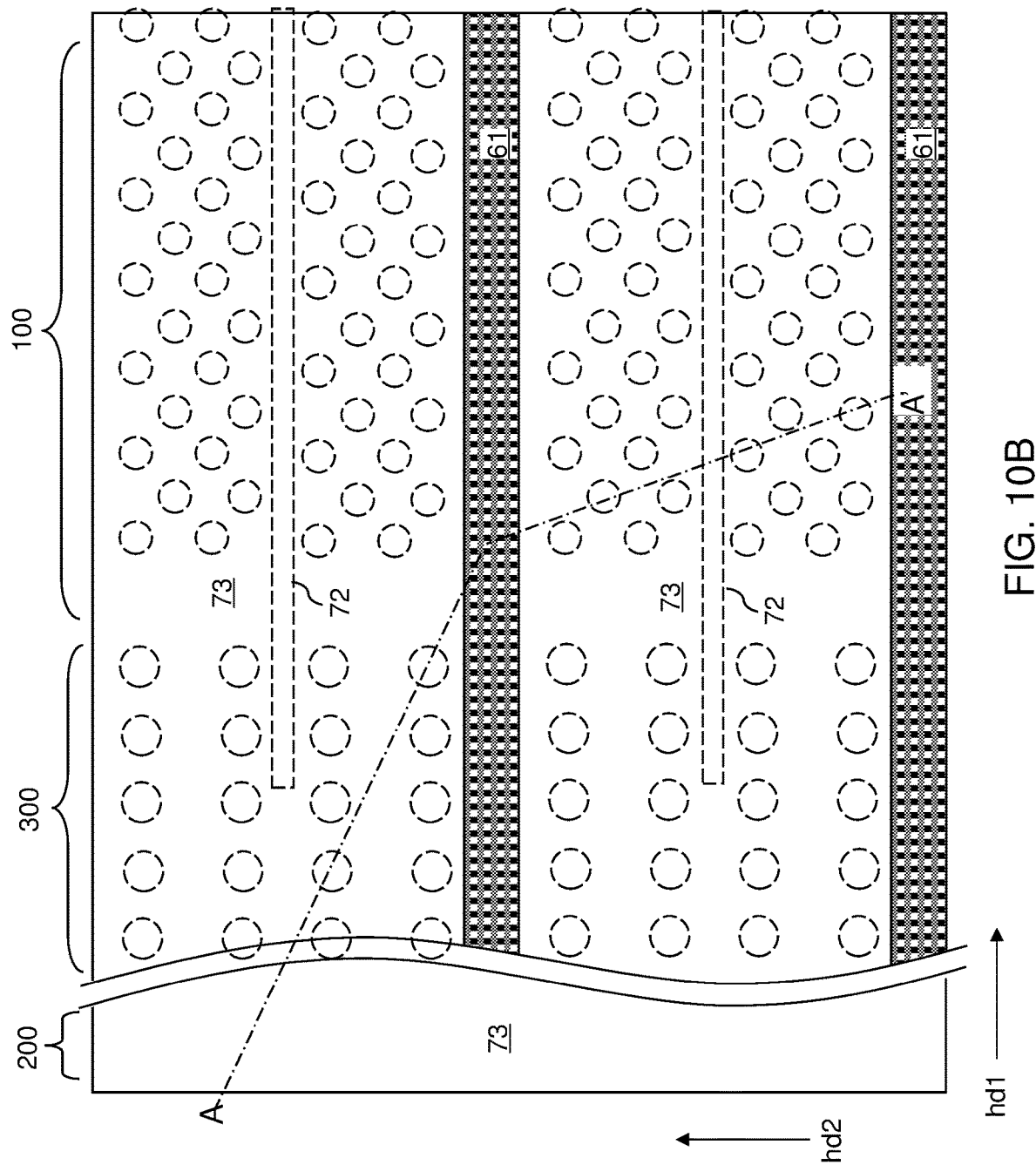
FIG. 10B is a partial see-through top-down view of the exemplary structure of FIG. 10A. The vertical plane A-A' is the plane of the schematic vertical cross-sectional view of FIG. 10A.

Referring to FIG. 13F, the alternative configuration of the exemplary structure is illustrated at a processing step that corresponds to the processing step of FIGS. 9G, 10A, and 10B.

Figure 14:
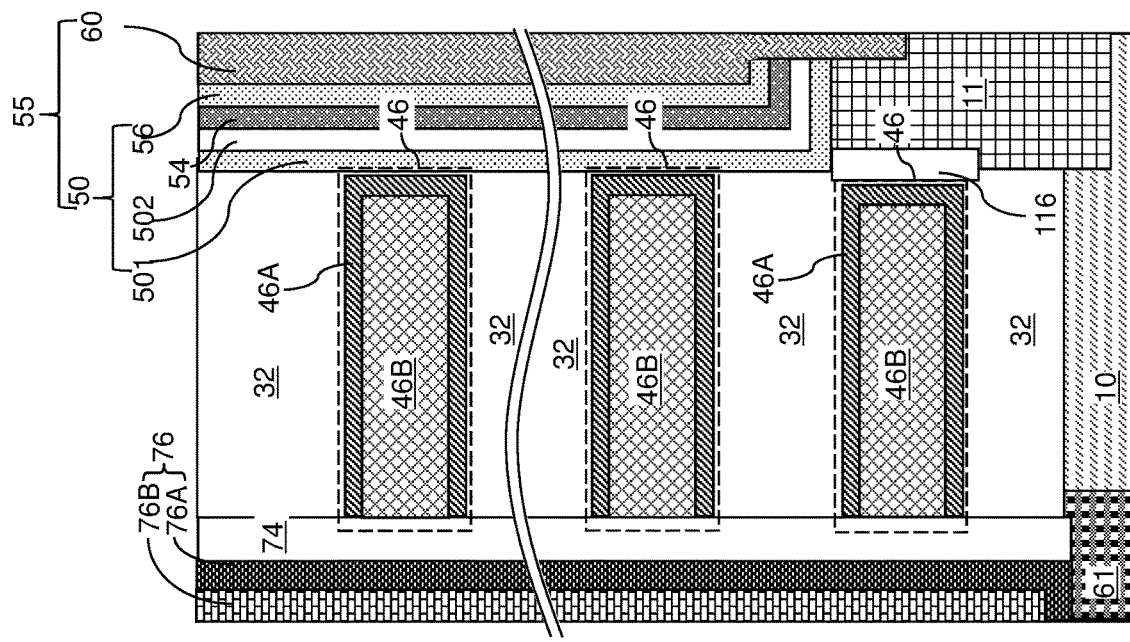
FIG. 14 is a magnified vertical cross-sectional view of a region of the alternative embodiment of the exemplary structure at a processing step corresponding to the processing steps of FIGS. 12A-12C.

Subsequently, the processing steps of FIGS. 11A and 11B, and 12A-12C can be performed. FIG. 14 is a magnified vertical cross-sectional view of a region of the alternative embodiment of the exemplary structure at a processing step corresponding to the processing steps of FIGS. 12A-12C. In the alternative configuration of the exemplary structure, each of the memory opening fill structures 58 comprises a dielectric metal oxide blocking dielectric layer 501 comprising a dielectric metal oxide material (e.g., aluminum oxide) and contacting a sidewall of a respective memory opening 49, and the sidewall of the respective memory opening 49 comprises a sidewall of each of the insulating layers 32 and a sidewall of each of the electrically conductive layers 46.

Referring to all drawings and according to various embodiments of the present disclosure, a three-dimensional memory device includes an alternating stack of insulating layers 32 and electrically conductive layers 46, memory openings 49 vertically extending through the alternating stack, and memory opening fill structures 58 located in the memory openings 49. Each of the memory opening fill structures 58 comprises a vertical stack of memory elements located at levels of the electrically conductive layers 46. Each of the electrically conductive layers 46 comprises a metallic barrier liner 46A containing an intermetallic compound of at least two elements that includes a first metal element including Ta or Ti, and a second metal element including at least one of Al or Mo, and metallic barrier liner containing less than 10 atomic percent of nitrogen and oxygen, and a metallic fill material layer 46B contacting the metallic barrier liner 46A.

In one embodiment, the first metal element is present within each of the metallic barrier liners 46A at an atomic percentage in a range from 10% to 65% and the second metal element is present within each of the metallic barrier liners 46A at an atomic percentage in a range from 20% to 75%.

In one embodiment, a sum of an atomic percentage of the first metal element and an atomic percentage of the second metal element within each of the metallic barrier liners is in a range from 90% to 100%. In one embodiment, the metallic barrier liner 46A contains 0 to 5 atomic percent of nitrogen and oxygen, such as 0 to 0.5 atomic percent nitrogen and 0 to 0.5 atomic percent oxygen.

In one embodiment, the first metal element comprises Ti and the second metal element comprises Al. For example, the intermetallic compound comprises at least one of a $TiAl_3$ phase, a TiAl phase, or a $Ti_3Al$ phase having a resistivity of 22 µOhm-cm to 80 µOhm-cm.

In another embodiment, the first metal element comprises Ta and the second metal element comprises Mo. For example, the intermetallic compound comprises $Ta_\alpha Mo_{(1-\alpha)}$, where α is in a range from 0.1 to 0.65.

In another embodiment, the first metal element comprises Ti and the second metal element comprises a combination of Al and Mo.

In one embodiment, the metallic fill material layers comprise W, Ta, Mo, Ru, Co or Ti. In one embodiment, each of the memory opening fill structures 58 comprises further comprises a vertical semiconductor channel 60 surrounded by the vertical stack of memory elements (e.g., portions of the memory material layer 54).

In one embodiment, each of the electrically conductive layers 46 is spaced from the memory opening fill structures 58, an overlying one of the insulating layers 32, and an underlying one of the insulating layers 32 by a backside blocking dielectric layer 44 comprising a dielectric metal oxide material.

In another embodiment, each of the memory opening fill structures 58 comprises a dielectric metal oxide blocking dielectric layer 501 comprising a dielectric metal oxide material and contacting a sidewall of a respective memory opening 49 and a silicon oxide blocking dielectric layer 502 contacting the dielectric metal oxide blocking dielectric layer 501; and the sidewall of the respective memory opening 49 comprises a sidewall of each of the insulating layers 32 and a sidewall of each of the electrically conductive layers 46.

In one embodiment, the three-dimensional memory device further comprises: a first backside trench fill structure (74, 76) comprising a first dielectric surface contacting a respective first sidewall of each layer within the alternating stack (32, 46), and a second backside trench fill structure (74, 76) comprising a second dielectric surface contacting a respective second sidewall of each layer within the alternating stack (32, 46).

In one embodiment, each of the first backside trench fill structure (74, 76) and the second backside trench fill structure (74, 76) comprises a respective insulating spacer 74 laterally surrounding a respective backside contact via structure 76, and the first dielectric surface and the second dielectric surface comprise portions of outer sidewalls of the insulating spacers 74 of the first backside trench fill structure (74, 76) and the second backside trench fill structure (74, 76).

In one embodiment, each of the first dielectric surface and the second dielectric surface contacts a respective one of the metallic barrier liners 46A and a respective one of the metallic fill material layers 46B at each level of the electrically conductive layers 46.

The exemplary structures can include a three-dimensional memory device. In one embodiment, the three-dimensional memory device comprises a three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a memory material layer 54 at a level of an electrically conductive layer 46) in a first device level of the array of monolithic three-dimensional NAND strings can be located over another memory cell (comprising another portion of the memory material layer 54 at a level of another electrically conductive layer 46) in a second device level of the array of monolithic three-dimensional NAND strings. The silicon substrate can contain an integrated circuit comprising a driver circuit (comprising a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion of each of the plurality of semiconductor channels (59, 11, 60) extends substantially perpendicular to a top surface of the substrate (9, 10) and comprising a respective one of the vertical semiconductor channels 60; and a plurality of charge storage elements (comprising portions of the memory films 50, i.e., portions of the memory material layer 54). Each charge storage element can be located adjacent to a respective one of the plurality of semiconductor channels (59, 11, 60).

The various embodiments of the present disclosure can be employed to provide a metallic barrier liner 46A having low electrical resistivity which functions as effective diffusion barrier structure for chlorine and fluorine atoms, and provides a high etch resistance.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers,
   memory openings vertically extending through the alternating stack; and
   memory opening fill structures located in the memory openings, wherein each of the memory opening fill structures comprises a vertical stack of memory elements located at levels of the electrically conductive layers,
   wherein each of the electrically conductive layers comprises:
   a metallic barrier liner comprising an intermetallic compound of at least two elements that includes a first metal element comprising Ta, and a second metal element which is Mo, and the metallic barrier liner containing less than 10 atomic percent of nitrogen and oxygen; and
   a metallic fill material layer contacting the metallic barrier liner.

2. The three-dimensional memory device of claim 1, wherein the first metal element is present within each of the metallic barrier liners at an atomic percentage in a range from 10% to 65%, and the second metal element is present within each of the metallic barrier liners at an atomic percentage in a range from 20% to 75%.

3. The three-dimensional memory device of claim 1, wherein a sum of an atomic percentage of the first metal element and an atomic percentage of the second metal element within each of the metallic barrier liners is in a range from 90% to 100%.

4. The three-dimensional memory device of claim 1, wherein the metallic barrier liner contains 0 to 5 atomic percent of nitrogen and oxygen.

5. The three-dimensional memory device of claim 1, wherein the metallic barrier liner contains 0 to 0.5 atomic percent nitrogen and 0 to 0.5 atomic percent oxygen.

6. The three-dimensional memory device of claim 1, wherein the first metal element consists essentially of Ta.

7. The three-dimensional memory device of claim 6, wherein the intermetallic compound consists essentially of $Ta_\alpha Mo_{(1-\alpha)}$, where $\alpha$ is in a range from 0.1 to 0.65.

8. The three-dimensional memory device of claim 1, wherein each of the memory opening fill structures comprises further comprises a vertical semiconductor channel surrounded by the vertical stack of memory elements.

9. The three-dimensional memory device of claim 8, wherein each of the electrically conductive layers is spaced from the memory opening fill structures, an overlying one of the insulating layers, and an underlying one of the insulating layers by a backside blocking dielectric layer comprising a dielectric metal oxide material.

10. The three-dimensional memory device of claim 8, wherein:
 each of the memory opening fill structures comprises a dielectric metal oxide blocking dielectric layer comprising a dielectric metal oxide material contacting a sidewall of a respective memory opening and a silicon oxide blocking dielectric layer contacting the dielectric metal oxide blocking dielectric layer; and
 the sidewall of the respective memory opening comprises a sidewall of each of the insulating layers and a sidewall of each of the electrically conductive layers.

11. The three-dimensional memory device of claim 1, wherein the metallic fill material layer consists essentially of an elemental metal selected from W, Ta, Mo, Ru, Co, or Ti.

12. A method of forming a three-dimensional memory device, comprising:
 forming an alternating stack of insulating layers and sacrificial material layers over a substrate;
 forming memory openings through the alternating stack;
 forming memory opening fill structures in the memory openings, wherein each of the memory opening fill structures comprises a vertical stack of memory elements;
 forming backside recesses by removing the sacrificial material layers selective to the insulating layers;
 forming a first metallic component layer comprising Ta, and a second metallic component layer consisting essentially of Mo in the backside recesses;
 forming a metallic barrier liner in the backside recesses by annealing the first metallic component layer and the second metallic component layer to form an intermetallic compound; and
 forming a metallic fill material layer within remaining unfilled volumes of the backside recesses on surfaces of the metallic barrier liner, wherein each contiguous combination of a respective one of the metallic barrier liner and a respective one of the metallic fill material layers constitutes an electrically conductive layer.

13. The method of claim 12, further comprising forming backside trenches laterally extending along a first horizontal direction through the alternating stack, wherein the backside recesses are formed by providing an isotropic etchant that etches a material of the sacrificial material layers selective to a material of the insulating layers into the backside trenches.

14. The method of claim 13, further comprising anisotropically etching portions of at least the second metallic component layer from within volumes of the backside trenches prior to annealing the first metallic component layer and the second metallic component layer, wherein the metallic barrier liners are formed within volumes of the backside recesses but not outside the volumes of the backside trenches.

15. The method of claim 14, further comprising depositing a backside blocking dielectric layer comprising a dielectric metal oxide material on physically exposed surfaces of the memory opening fill structures and on physically exposed surfaces of the insulating layers within the backside recesses and the backside trenches, wherein the first metallic component layer and the second metallic component layer are deposited over the backside blocking dielectric layer.

16. The method of claim 14, wherein forming the memory opening fill structures comprises:
 forming a dielectric metal oxide blocking dielectric layer comprising a dielectric metal oxide material directly on a sidewall of each of the memory openings;
 forming a silicon oxide blocking dielectric on the dielectric metal oxide blocking dielectric layer withing each of the memory openings;
 forming a memory material layer over the silicon oxide blocking dielectric layer within each of the memory openings, wherein the memory material layer comprises a respective vertical stack of memory elements;
 forming a vertical semiconductor channel over the memory material layer within each of the memory openings; and
 forming a drain region contacting a top end of the vertical semiconductor channel within each of the memory openings.

17. The method of claim 12, wherein the metallic barrier liner contains less than 10 atomic percent of nitrogen and oxygen.

18. A three-dimensional memory device, comprising:
 an alternating stack of insulating layers and electrically conductive layers,
 memory openings vertically extending through the alternating stack; and
 memory opening fill structures located in the memory openings, wherein each of the memory opening fill structures comprises a vertical stack of memory elements located at levels of the electrically conductive layers,
 wherein each of the electrically conductive layers comprises:
 a metallic barrier liner comprising an intermetallic compound of at least two elements that includes a first metal element comprising Ta, and a second metal element which is Mo; and
 a metallic fill material layer contacting the metallic barrier liner.

19. The three-dimensional memory device of claim 18, wherein the intermetallic compound consists essentially of the first metal element and the Mo.

20. The three-dimensional memory device of claim 18, wherein the metallic fill material layer consists essentially of an elemental metal selected from W, Ta, Mo, Ru, Co, or Ti.

* * * * *